(12) United States Patent
Takahashi et al.

(10) Patent No.: US 9,902,851 B2
(45) Date of Patent: Feb. 27, 2018

(54) RESIN COMPOSITION, PREPREG, LAMINATE, AND PRINTED WIRING BOARD

(71) Applicant: MITSUBISHI GAS CHEMICAL COMPANY, INC., Tokyo (JP)

(72) Inventors: Hiroshi Takahashi, Tokyo (JP); Tomo Chiba, Tokyo (JP); Nobuyoshi Ohnishi, Tokyo (JP); Katsuya Tomizawa, Tokyo (JP); Keisuke Takada, Tokyo (JP); Eisuke Shiga, Tokyo (JP); Takaaki Ogashiwa, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 346 days.

(21) Appl. No.: 14/435,585

(22) PCT Filed: Oct. 18, 2013

(86) PCT No.: PCT/JP2013/078389
§ 371 (c)(1),
(2) Date: Apr. 14, 2015

(87) PCT Pub. No.: WO2014/061812
PCT Pub. Date: Apr. 24, 2014

(65) Prior Publication Data
US 2015/0267047 A1 Sep. 24, 2015

(30) Foreign Application Priority Data

Oct. 19, 2012 (JP) .................................. 2012-231632
Aug. 19, 2013 (JP) .................................. 2013-169894

(51) Int. Cl.
| | |
|---|---|
| *C08L 63/00* | (2006.01) |
| *C08G 59/62* | (2006.01) |
| *H05K 1/03* | (2006.01) |
| *C08J 5/24* | (2006.01) |
| *C08K 3/34* | (2006.01) |
| *C08K 3/36* | (2006.01) |
| *B32B 15/092* | (2006.01) |

(Continued)

(52) U.S. Cl.
CPC .............. *C08L 63/00* (2013.01); *B32B 5/024* (2013.01); *B32B 15/092* (2013.01); *B32B 15/14* (2013.01); *B32B 27/06* (2013.01); *B32B 27/28* (2013.01); *B32B 27/283* (2013.01); *B32B 27/38* (2013.01); *C08G 59/621* (2013.01); *C08J 5/24* (2013.01); *C08K 3/34* (2013.01); *C08K 3/36* (2013.01); *C08L 83/06* (2013.01); *H05K 1/0353* (2013.01); *B32B 2250/02* (2013.01); *B32B 2260/021* (2013.01); *B32B 2260/046* (2013.01); *B32B 2262/101* (2013.01); *B32B 2307/202* (2013.01); *B32B 2307/206* (2013.01); *B32B 2307/306* (2013.01); *B32B 2457/08* (2013.01); *C08G 77/045* (2013.01); *C08G 77/14* (2013.01); *C08J 2363/00* (2013.01); *C08J 2365/00* (2013.01); *C08J 2383/06* (2013.01); *C08J 2463/00* (2013.01); *C08J 2479/04* (2013.01); *C08J 2483/06* (2013.01); *C08L 2201/08* (2013.01); *C08L 2203/20* (2013.01); *C08L 2205/03* (2013.01); *C08L 2205/035* (2013.01); *H05K 2201/012* (2013.01);
(Continued)

(58) Field of Classification Search
CPC .......... C08L 83/04; C08L 83/06; C08L 63/00; C08G 77/045; C08G 77/14
See application file for complete search history.

(56) References Cited

U.S. PATENT DOCUMENTS 3,284,398 A * 11/1966 Warren ................ C08G 59/306
523/220
5,863,970 A * 1/1999 Ghoshal ............... C08G 59/226
257/E21.505

(Continued)

FOREIGN PATENT DOCUMENTS

| CN | 101343412 | 1/2009 |
|---|---|---|
| CN | 103635530 | 3/2014 |

(Continued)

OTHER PUBLICATIONS

Homma Hiroki, machine translation of WO 2011/065365 A1, Jun. 3, 2011.*

(Continued)

*Primary Examiner* — Marc Zimmer
(74) *Attorney, Agent, or Firm* — Greenblum & Bernstein, P.L.C.

(57) ABSTRACT

A resin composition containing a cyclic epoxy-modified silicone compound (A) represented by formula (1), a cyanic acid ester compound (B) and/or a phenol resin (C) and an inorganic filler (D):

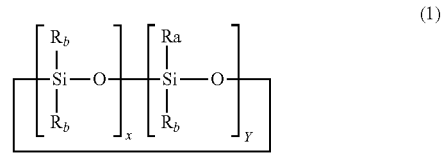

wherein $R_a$ each independently represent an organic group having an epoxy group; $R_b$ each independently represent a substituted or unsubstituted monovalent hydrocarbon group; x represents an integer of 0 to 2; and y represents an integer of 1 to 6; and the siloxane unit marked with x and the siloxane unit marked with y are arranged mutually at random.

38 Claims, No Drawings

(51) Int. Cl.
*B32B 27/06* (2006.01)
*B32B 27/28* (2006.01)
*B32B 27/38* (2006.01)
*B32B 5/02* (2006.01)
*B32B 15/14* (2006.01)
*C08L 83/06* (2006.01)
*C08G 77/04* (2006.01)
*C08G 77/14* (2006.01)

(52) U.S. Cl.
CPC ............... *H05K 2201/0162* (2013.01); *H05K 2201/029* (2013.01); *H05K 2201/0209* (2013.01); *Y10T 428/31511* (2015.04); *Y10T 428/31529* (2015.04)

(56) References Cited

U.S. PATENT DOCUMENTS

| | | | |
|---|---|---|---|
| 2009/0017316 | A1 | 1/2009 | Kato et al. |
| 2012/0247820 | A1 | 10/2012 | Miyatake et al. |
| 2013/0037310 | A1 | 2/2013 | Kimura et al. |
| 2013/0045650 | A1 | 2/2013 | Ogashiwa et al. |
| 2013/0101863 | A1* | 4/2013 | Mabuchi ............ C08G 59/5073 428/457 |
| 2013/0136930 | A1 | 5/2013 | Kato et al. |
| 2013/0157061 | A1 | 6/2013 | Sogame et al. |
| 2013/0194261 | A1* | 8/2013 | Cummins ............ A61B 5/0075 345/420 |

FOREIGN PATENT DOCUMENTS

| | | |
|---|---|---|
| EP | 2 666 825 | 11/2013 |
| EP | 2 716 710 | 4/2014 |
| EP | 2 886 339 | 6/2015 |
| JP | 4-261461 | 9/1992 |
| JP | 8-48001 | 2/1996 |
| JP | 10-45872 | 2/1998 |
| JP | 2000-158589 | 6/2000 |
| JP | 3173332 | 3/2001 |
| JP | 2003-246849 | 9/2003 |
| JP | 2006-143973 | 6/2006 |
| JP | 2007-138002 | 6/2007 |
| JP | 2009-35728 | 2/2009 |
| JP | 2010-24265 | 2/2010 |
| JP | 2011-132416 | 7/2011 |
| JP | 2011-236207 | 11/2011 |
| JP | 2013-035880 | 2/2013 |
| WO | WO-2011065365 A1 * | 6/2011 |
| WO | 2011/108524 | 9/2011 |
| WO | 2011/132674 | 10/2011 |
| WO | WO 2011/132674 A1 * | 10/2011 |
| WO | 2011/138865 | 11/2011 |
| WO | 2011/152402 | 12/2011 |
| WO | 2012/029690 | 3/2012 |
| WO | 2012/099132 | 7/2012 |

OTHER PUBLICATIONS

Database WPI Week 201178 (XP-002757606), which corresponds to JP2011-236207, dated Nov. 24, 2011.
Search report from PCT/JP2013/078389, dated Jan. 21, 2014.
International Preliminary Examination Report in PCT/JP2013/078389 dated Apr. 21, 2015.

* cited by examiner

RESIN COMPOSITION, PREPREG, LAMINATE, AND PRINTED WIRING BOARD

TECHNICAL FIELD

The present invention relates to a resin composition, a prepreg, a laminate and a printed-wiring board.

BACKGROUND ART

Semiconductors have been widely used in e.g., electronic equipment, communication machines and personal computers. Recently high integration, high function and dense package of the semiconductors have been more and more accelerated. According to the tendency, requirements for laminates used in semiconductor packages have been diversified. In addition to the properties such as heat resistance, chemical resistance, flame retardation and reliability conventionally required, various properties including low thermal expansion, high glass transition temperature and high elasticity are required.

In recent years, in particular, a laminate with low thermal expansion has been strongly required. This is because the coefficient of thermal expansion between semiconductor devices and a printed-wiring board for a semiconductor plastic package is conventionally large, and thus, if thermal shock or the like is applied in manufacturing steps, the semiconductor plastic package warps due to the thermal-expansion difference between them, with the result that connection failure occurs between semiconductor devices and the printed-wiring board for a semiconductor plastic package and between a semiconductor plastic package and the printed-wiring board to be packaged.

As a method for reducing the coefficient of thermal expansion along the plane of a laminate, using an inorganic filler is a conceivable approach. It was difficult to blend an inorganic filler in a large amount, however, because it is necessary to blend a multifunctional resin to maintain a high glass transition temperature and the multifunctional resin is highly viscous. As another approach, it is known to add an organic filler having rubber elasticity to a varnish containing an epoxy resin (Patent Documents 1 to 6). As another approach for obtaining the same effect as in adding a rubber elastic component while maintaining a charge amount of inorganic filler, blending a silicone resin is known (Patent Documents 7 to 9).

PATENT DOCUMENT

Patent Document 1: Japanese Patent No. 3173332
Patent Document 2: Japanese Patent Laid-Open No. 8-48001
Patent Document 3: Japanese Patent Laid-Open No. 2000-158589
Patent Document 4: Japanese Patent Laid-Open No. 2003-246849
Patent Document 5: Japanese Patent Laid-Open No. 2006-143973
Patent Document 6: Japanese Patent Laid-Open No. 2009-035728
Patent Document 7: Japanese Patent Laid-Open No. 10-45872
Patent Document 8: Japanese Patent Laid-Open No. 2010-24265
Patent Document 9: International Publication No. WO 2012/99132

SUMMARY OF THE INVENTION

Problems to be Solved by the Invention

The aforementioned background art has still points to be improved. For example, as to Patent Documents 1 to 6, when a varnish is used, the charge amount of an inorganic filler is limited by blending an organic filler. In addition to this problem, there is a problem in that since the organic filler having rubber elasticity is highly combustible, a bromine-based flame retardant is sometimes inevitably used in order to keep flame retardancy of a laminate, giving a burden to environment.

As to Patent Documents 7 to 9, a general silicone resin has a problem in that chemical resistance to alkali is poor. If the chemical resistance to alkali is poor, after processing with e.g., a mechanical drill and a laser drill, contamination of a chemical agent used in de-smear step for removing smear (resin residue, etc.) occurs as a problem. Furthermore, a low production stability of a printed-wiring board is a problem. In addition, since a frequency of newly making up a chemical agent solution increases, an increasing in a manufacturing cost is also a problem.

When a general silicone resin is used, another problem occurs, which is a reduction in heat resistance. With recent growing concern on environmental issue, a lead-free solder is used in a reflow step for connecting e.g., silicon chips, a printed wiring board for a plastic package and a mother board; however, the lead-free solder must be treated at high temperature. Because of this, if heat resistance reduces, there are such problems that delamination occurs between prepregs of a printed-wiring board and between a prepreg and copper foil in the reflow step. Furthermore, for example, in consideration of environment, it is desired to obtain desired physical properties without using a halogen compound, a phosphorus compound or the like.

The present invention was made under the above circumstances, and is directed to providing a resin composition that can realize a laminate having high heat resistance, low coefficient of thermal expansion along the plane and excellent chemical resistance without using a halogen compound or a phosphorus compound, and also providing a prepreg, a laminate, a metal foil-clad laminate and a printed-wiring board using the resin composition.

Means for Solving the Problems

The present inventors found that a laminate obtained from a resin composition obtained by blending a cyclic epoxy-modified silicone compound, a cyanic acid ester compound and/or a phenol resin and an inorganic filler or a resin composition obtained by a cyclic epoxy-modified silicone compound, a BT resin and an inorganic filler, without using a halogen compound or a phosphorus compound, has high heat resistance, low coefficient of thermal expansion along the plane and excellent chemical resistance, and arrived at the present invention.

More specifically, the present invention is as follows.

[1]

A resin composition containing a cyclic epoxy-modified silicone compound (A) represented by formula (1), a cyanic acid ester compound (B) and/or a phenol resin (C) and an inorganic filler (D):

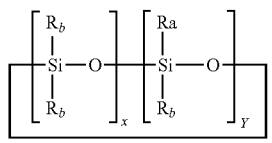
(1)

wherein $R_a$ each independently represent an organic group having an epoxy group; $R_b$ each independently represent a substituted or unsubstituted monovalent hydrocarbon group; x represents an integer of from 0 to 2; and y represents an integer of from 1 to 6; and the siloxane unit marked with x and the siloxane unit marked with y are arranged mutually at random.

[2]
The resin composition according to [1], in which the epoxy group of the cyclic epoxy-modified silicone compound (A) represented by formula (1) is a 3,4-epoxycyclohexylethyl group.

[3]
The resin composition according to [1] or [2], in which a ratio of a cyanate group equivalent of the cyanic acid ester compound (B) and/or a hydroxyl group equivalent of the phenol resin (C) to an epoxy group equivalent of an epoxy compound contained in the resin composition is from 0.3 to 0.7, wherein the cyanate group equivalent of the cyanic acid ester compound (B) and/or the hydroxyl group equivalent of the phenol resin (C) is set as a numerator and the epoxy group equivalent of an epoxy compound contained in the resin composition is set as a denominator.

[4]
The resin composition according to any one of [1] to [3], further containing a non-halogen epoxy resin (E).

[5]
The resin composition according to any one of [1] to [4], further containing a maleimide compound (F).

[6]
The resin composition according to any one of [1] to [5], in which the cyanic acid ester compound (B) is a naphtholaralkyl-based cyanic acid ester compound represented by formula (5) and/or a novolac-based cyanic acid ester compound represented by formula (6):

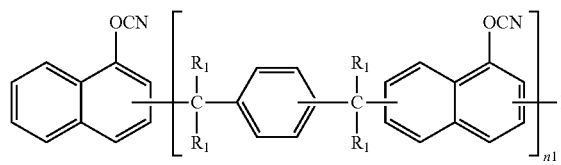
(5)

wherein $R_1$ each independently represent a hydrogen atom or a methyl group and n1 represents an integer of 1 or more,

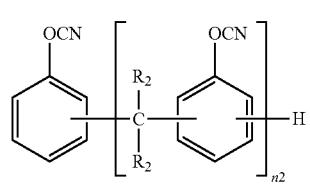
(6)

wherein $R_2$ each independently represent a hydrogen atom or a methyl group and n2 represents an integer of 1 or more.

[7]
The resin composition according to any one of [1] to [6], in which the phenol resin (C) is a naphtholaralkyl-based phenol resin represented by formula (7) and/or a biphenylaralkyl-based phenol resin represented by formula (8):

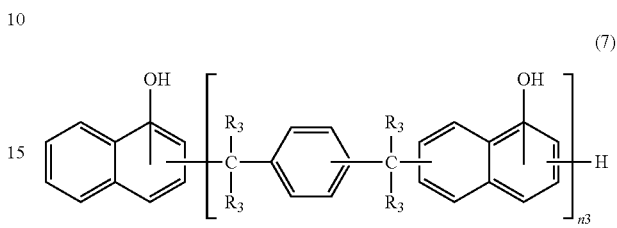
(7)

wherein $R_3$ each independently represent a hydrogen atom or a methyl group and n3 represents an integer of 1 or more,

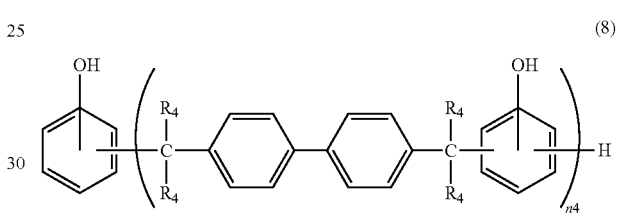
(8)

wherein $R_4$ represents a hydrogen atom or a methyl group and n4 represents an integer of 1 or more.

[8]
The resin composition according to any one of [5] to [7], in which the maleimide compound (F) is a compound represented by formula (15):

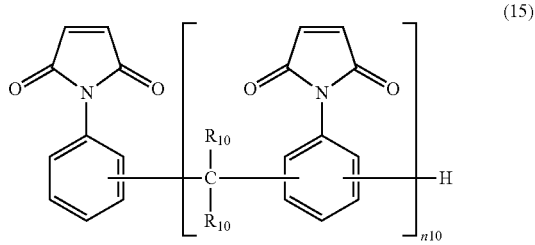
(15)

wherein $R_{10}$ each independently represent a hydrogen atom or a methyl group and n10 represents an integer of 1 or more.

[9]
The resin composition according to any one of [5] to [8], in which the content of the cyclic epoxy-modified silicone compound (A) based on 100 parts by mass of the total amount of the cyclic epoxy-modified silicone compound (A), the cyanic acid ester compound (B), the phenol resin (C), the non-halogen epoxy resin (E), and the maleimide compound (F) is from 5 to 50 parts by mass.

[10]
The resin composition according to any one of [5] to [9], in which the total content of the cyanic acid ester compound (B) and the phenol resin (C) based on 100 parts by mass of the total amount of the cyclic epoxy-modified silicone compound (A), the cyanic acid ester compound (B), the phenol resin (C), the non-halogen epoxy resin (E), and the maleimide compound (F) is from 10 to 50 parts by mass.

[11]

The resin composition according to any one of [5] to [10], in which the content of the inorganic filler (D) based on 100 parts by mass of the total amount of the cyclic epoxy-modified silicone compound (A), the cyanic acid ester compound (B), the phenol resin (C), the non-halogen epoxy resin (E) and the maleimide compound (F) is from 50 to 500 parts by mass.

[12]

The resin composition according to any one of [5] to [11], in which the content of the maleimide compound (F) based on 100 parts by mass of the total amount of the cyclic epoxy-modified silicone compound (A), the cyanic acid ester compound (B), the phenol resin (C), the non-halogen epoxy resin (E) and the maleimide compound (F) is from 5 to 50 parts by mass.

[13]

A resin composition containing a cyclic epoxy-modified silicone compound (A) represented by formula (1), a BT resin (G) obtained by pre-polymerizing a cyanic acid ester compound and a maleimide compound, and an inorganic filler (D):

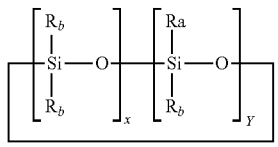

wherein $R_a$ each independently represent an organic group having an epoxy group; $R_b$ each independently represent a substituted or unsubstituted monovalent hydrocarbon group; x represents an integer of from 0 to 2; and y represents an integer of from 1 to 6; and the siloxane unit marked with x and the siloxane unit marked with y are arranged mutually at random.

[14]

The resin composition according to [13], in which a ratio of a cyanate group equivalent of the cyanic acid ester compound used in the BT resin (G) to an epoxy group equivalent of an epoxy compound contained in the resin composition is from 0.3 to 0.7, wherein the cyanate group equivalent is set as a numerator and the epoxy group equivalent is set as a denominator.

[15]

The resin composition according to [13] or [14], further containing a non-halogen epoxy resin (E).

[16]

The resin composition according to any one of [13] to [15], in which the cyanic acid ester compound (B) used in the BT resin (G) is a naphtholaralkyl-based cyanic acid ester compound represented by formula (5) and/or a novolac-based cyanic acid ester compound represented by formula (6):

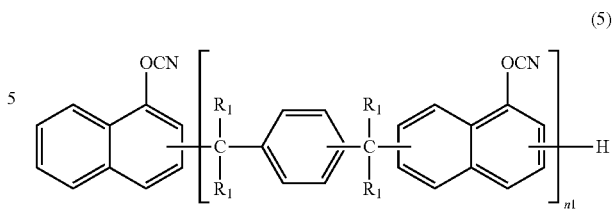

wherein $R_1$ each independently represent a hydrogen atom or a methyl group and n1 represents an integer of 1 or more,

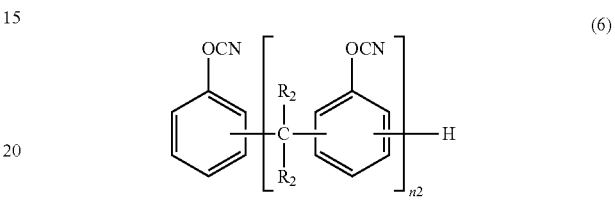

wherein $R_2$ each independently represent a hydrogen atom or a methyl group and n2 represents an integer of 1 or more.

[17]

The resin composition according to any one of [13] to [16], in which the male imide compound used in the BT resin (G) is a compound represented by formula (15):

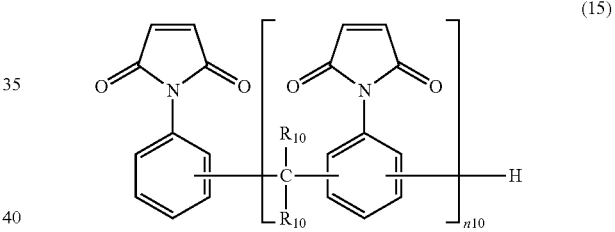

wherein $R_{10}$ each independently represent a hydrogen atom or a methyl group and n10 represents an integer of 1 or more.

[18]

The resin composition according to any one of [15] to [17], in which the content of the cyclic epoxy-modified silicone compound (A) based on 100 parts by mass of the total amount of the cyclic epoxy-modified silicone compound (A), the BT resin (G) and the non-halogen epoxy resin (E) is from 5 to 50 parts by mass.

[19]

The resin composition according to any one of [15] to [18], in which the content of the BT resin (G) based on 100 parts by mass of the total amount of the cyclic epoxy-modified silicone compound (A), the BT resin (G) and the non-halogen epoxy resin (E) is from 20 to 80 parts by mass.

[20]

The resin composition according to any one of [15] to [19], in which the content of the inorganic filler (D) based on 100 parts by mass of the total amount of the cyclic epoxy-modified silicone compound (A), the BT resin (G) and the non-halogen epoxy resin (E) is from 50 to 500 parts by mass.

[21]

The resin composition according to any one of [1] to [20], further containing an imidazole compound (H) represented by formula (16):

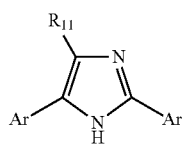

(16)

wherein Ar each independently represent one selected from the group consisting of a phenyl group, a naphthalene group, a biphenyl group, an anthracene group or groups obtained by modifying these groups with a hydroxyl group; $R_{11}$ represents a hydrogen atom, an alkyl group, an alkyl group modified with a hydroxyl group or an aryl group.

[22]

The resin composition according to [21], in which the imidazole compound (H) is 2,4,5-triphenylimidazole.

[23]

The resin composition according to any one of [1] to [22], in which the inorganic filler (D) is boehmite and/or silica.

[24]

The resin composition according to any one of [4] to [12] and [15] to [23], in which the non-halogen epoxy resin (E) is one or more selected from the group consisting of a phenolphenylaralkyl novolac-based epoxy resin, a biphenylaralkyl-based epoxy resin, a naphtholaralkyl-based epoxy resin, an anthraquinone-based epoxy resin and a polyoxynaphthylene-based epoxy resin.

[25]

A prepreg having the resin composition according to any one of [1] to [24] and a substrate impregnated or coated with the resin composition.

[26]

The prepreg according to [25], in which the substrate is one or more selected from the group consisting of E glass cloth, T glass cloth, S glass cloth, Q glass cloth, an organic fiber and an organic film.

[27]

A laminate having the prepreg according to [25] or [26].

[28]

A metal foil-clad laminate containing the prepreg according to [25] or [26] and a metal foil laminated on the prepreg.

[29]

A printed-wiring board having an insulating layer containing the resin composition according to any one of [1] to [29], and a conductive layer formed on a surface of the insulating layer.

Advantageous Effects of the Invention

According to the present invention, it is possible to provide a resin composition that can realize a laminate having high heat resistance, low coefficient of thermal expansion along the plane and excellent chemical resistance without using a halogen compound and a phosphorus compound, and also provide a prepreg, a laminate, a metal foil-clad laminate and a printed-wiring board using the resin composition.

MODES FOR CARRYING OUT THE INVENTION

Now, an embodiment (hereinafter simply referred to as "the embodiment") for carrying out the invention will be more specifically described below. The following embodiment is just an example for illustrating the present invention and will not be construed as limiting the present invention to the following content. The present invention can be appropriately modified within the gist and carried out.

The resin composition according to an aspect of the embodiment is a resin composition containing a cyclic epoxy-modified silicone compound (A) represented by formula (1), a cyanic acid ester compound (B) and/or a phenol resin (C) and an inorganic filler (D).

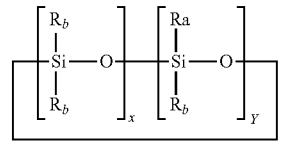

(1)

wherein $R_a$ each independently represent an organic group having an epoxy group; $R_b$ each independently represent a substituted or unsubstituted monovalent hydrocarbon group; x represents an integer of 0 to 2; and y represents an integer of 1 to 6; and the siloxane unit marked with x and the siloxane unit marked with y are arranged mutually at random.

The resin composition according to another aspect of the embodiment is a resin composition containing a cyclic epoxy-modified silicone compound (A) represented by the above formula (1), a BT resin (G) obtained by pre-polymerizing a cyanic acid ester compound and a maleimide compound, and an inorganic filler (D).

The resin compositions according to the above aspects can realize a laminate having high heat resistance, low coefficient of thermal expansion along the plane and excellent chemical resistance, without using a halogen compound and a phosphorus compound. In addition, the laminate is sufficiently expected to maintain equivalent flame retardation to that of a laminate, etc. formed by curing a conventional prepreg.

Now, components of the composition according to each aspect will be described. Note that, unless otherwise specified, explanation as to individual components that will be described below are common in each of the aspects mentioned above.

(Cyclic Epoxy-Modified Silicone Compound (A))

The cyclic epoxy-modified silicone compound (A) has a structure represented by the above formula (1). More specifically, the component (A) is prepared by introducing a substituted or unsubstituted aliphatic hydrocarbon group having an epoxy group into a silicone compound having a cyclic siloxane bond (Si—O—Si bond) in the main skeleton.

A low thermal expansible laminate can be obtained by using a cyclic epoxy-modified silicone compound (A) in combination with a cyanic acid ester compound (B) and/or a phenol resin (C) and an inorganic filler (D). A further lower thermal expansible laminate is likely to be obtained by using a cyclic epoxy-modified silicone compound (A) in combination with a BT resin (G) obtained by pre-polymerizing a cyanic acid ester compound and a maleimide compound, and inorganic filler (D).

The above cyclic epoxy-modified silicone compound (A) is a cyclic epoxy-modified silicone resin having a repeat unit represented by the above formula (1). It is preferable that the cyclic epoxy-modified silicone compound (A) be a silicone compound having at least one epoxy group in a single molecule and containing no alkoxy group. The cyclic epoxy-modified silicone compound (A) is preferably liquid at normal temperature since workability is excellent.

In the above formula (1), specific examples of the organic group having an epoxy group represented by $R_a$ may include substituted or unsubstituted aliphatic hydrocarbon groups having an epoxy group. The number of carbon atoms in the organic group is preferably 2 to 20 and more preferably 2 to 12. More specific examples of the organic group may include, but not particularly limited to, a glycidoxypropyl group and a 3,4-epoxycyclohexylethyl group. In particular, an organic group having 3,4-epoxycyclohexylethyl group is preferred since cure shrinkage decreases and the organic group plays a significant role in preventing alkali erosion to a siloxane bond.

In the above formula (1), specific examples of the monovalent hydrocarbon group represented by $R_b$ may include substituted or unsubstituted aliphatic hydrocarbon groups. The number of carbon atoms in the hydrocarbon group is preferably 1 to 20 and more preferably 1 to 8. More specific examples thereof may include, but not particularly limited to, alkyl groups such as a methyl group, an ethyl group, a propyl group, a butyl group, a hexyl group and an octyl group, a group obtained by substituting whole or part of hydrogen atoms of each of these monovalent hydrocarbon groups with e.g., an epoxy group (excluding an epoxycyclohexyl group), a methacryl group, an acryl group, a mercapto group, an amino group and a phenyl group. Of them, a methyl group, an ethyl group, a propyl group and a phenyl group are preferred as $R_b$; and a methyl group and a phenyl group are more preferred.

Note that, in the silicone compound having a repeat unit represented by the above formula (1), it is preferable that x be 0 and more preferable that x be 0 and y be 4 to 6. If the repeat unit of the silicone compound falls within the above range, epoxy groups are more easily arranged around a siloxane bond and an effect of preventing alkali erosion to the siloxane bond is further increased. As a result, chemical resistance is further improved (note that, the effect of the embodiment is not limited to these).

The molecular weight of an epoxy-modified silicone compound (A) is not particularly limited; however, a number average molecular weight (Mn) thereof is preferably 100 to 5000 and among them, is more preferably 300 to 2000 in view of handling. The number average molecular weight can be determined by gel permeation chromatography (GPC).

The epoxy equivalent of an epoxy-modified silicone compound (A) is preferably 50 to 2000 g/eq. Of them, 100 to 500 g/eq. is more preferred in view of handling. The epoxy equivalent can be determined by the method described in Examples (described later).

As the viscosity at 25° C. of an epoxy-modified silicone compound (A) is preferably 5 to 5000 mm²/S. In view of handling, it is more preferable that the viscosity is 5 to 3000 mm²/S. The viscosity can be measured by a Type-B viscometer in accordance with JIS Z8803.

An epoxy-modified silicone compound (A) can be produced by a known method. As an epoxy-modified silicone compound (A), a commercially available product also can be used, which may include trade names "X-40-2678", "X-40-2720" and "X-40-2672". Trade name, "X-40-2670" as an epoxy-modified silicone compound represented by the following formula (2); trade name "X-40-2705" as an epoxy-modified silicone compound represented by the following formula (3); trade name "X-40-2701" (all of them manufactured by Shin-Etsu Chemical Co., Ltd.) as an epoxy-modified silicone compound represented by the following formula (4) each can be suitably used.

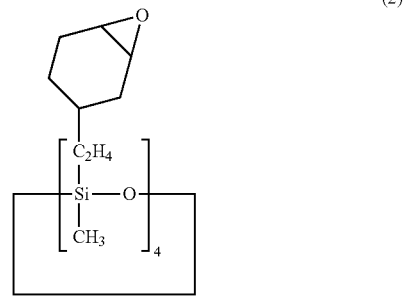

(2)

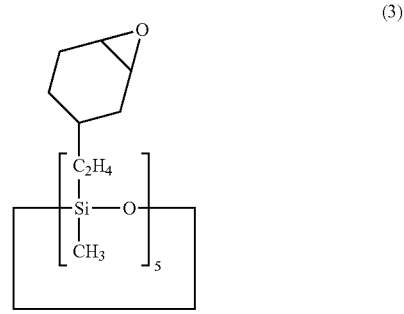

(3)

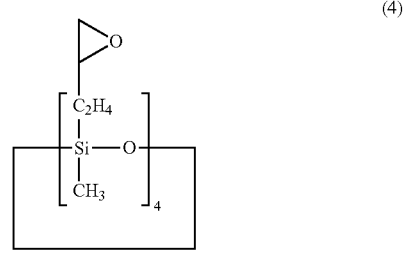

(4)

In the resin composition of the embodiment, the content of a cyclic epoxy-modified silicone compound (A) is not particularly limited; however, the content based on the total amount (100 parts by mass) of the cyclic epoxy-modified silicone compound (A), a cyanic acid ester compound (B), a phenol resin (C), and a non-halogen epoxy resin (E) and a maleimide compound (F) contained as optional components is preferably 5 to 50 parts by mass and more preferably 10 to 40 parts by mass. If the content of a cyclic epoxy-modified silicone compound (A) falls within the above range, glass transition temperature, heat resistance and low thermal expandability are further improved.

In the aspect where the resin composition contains a BT resin (G), the content of a cyclic epoxy-modified silicone compound (A) based on the total amount (100 parts by mass) of a cyclic epoxy-modified silicone compound (A), a BT resin (G) and a non-halogen epoxy resin (E) contained as an optional component is preferably 5 to 50 parts by mass and more preferably 10 to 40 parts by mass. If the content of a cyclic epoxy-modified silicone compound (A) falls within the above range, glass transition temperature, heat resistance and low thermal expandability are further improved.

A cyanic acid ester compound (B), since it has excellent properties such as excellent chemical resistance and adhesiveness, can be used as a component of the resin composition of the embodiment.

Examples of the cyanic acid ester compound (B) may include a naphtholaralkyl-based cyanic acid ester compound represented by formula (5), a novolac-based cyanic acid ester represented by formula (6), a biphenylaralkyl-based cyanic acid ester, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone and 2,2'-bis(4-cyanatophenyl)propane.

Of them, a naphtholaralkyl-based cyanic acid ester compound represented by formula (5), a novolac-based cyanic acid ester represented by formula (6) and a biphenylaralkyl-based cyanic acid ester are preferred; and a naphtholaralkyl-based cyanic acid ester compound represented by formula (5) and a novolac-based cyanic acid ester represented by formula (6) are more preferred. If these are used, flame retardation, harden ability and low thermal expandability are further improved.

(5)

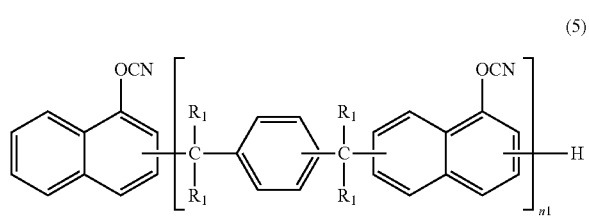

wherein $R_1$ each independently represent a hydrogen atom or a methyl group and n1 represents an integer of 1 or more.

It is preferable that $R_1$ be a hydrogen atom. The upper limit value of n1 is preferably 10 or less and more preferably 6 or less.

(6)

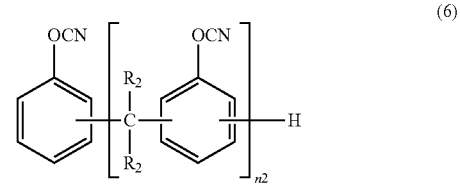

wherein $R_2$ each independently represent a hydrogen atom or a methyl group and n2 represents an integer of 1 or more.

It is preferable that $R_2$ be a hydrogen atom. The upper limit value of n2 is preferably 10 or less and more preferably 7 or less.

A method for producing a cyanic acid ester compound (B) is not particularly limited; however, a method used as a method for producing a cyanic acid ester can be employed. As an example of the method for producing a cyanic acid ester compound (B), a method of reacting a naphtholaralkyl-based phenol resin represented by formula (7) and a cyanogen halide in an inert organic solvent in the presence of a basic compound, is mentioned. In addition, a method of obtaining a cyanic acid ester compound (B) by forming a salt of a naphtholaralkyl-based phenol resin and a basic compound in an aqueous solution and performing a two-phase interface reaction with a cyanogen halide, is also mentioned.

(7)

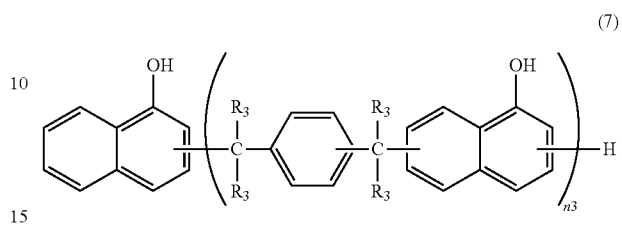

wherein $R_3$ each independently represent a hydrogen atom or a methyl group and n3 represents an integer of 1 or more.

A naphtholaralkyl-based cyanic acid ester compound can be selected from those obtained by condensation between a naphthol aralkyl resin, which is obtained by a reaction between a naphthol such as α-naphthol or β-naphthol and p-xylylene glycol, α,α'-dimethoxy-p-xylene or 1,4-di(2-hydroxy-2-propyl)benzene, and a cyanic acid.

The kind of phenol resin (C) is not particularly limited as long as it is a resin having at least two phenolic hydroxyl groups in a single molecule, for example, a known resin can be appropriately used.

Specific examples of the phenol resin (C) may include, but not particularly limited to, a cresol novolac-based phenol resin, a phenol novolac resin, an alkylphenol novolac resin, a bisphenol A-based novolac resin, a dicyclopentadiene-based phenol resin, a XyLoc-based phenol resin, a terpene-modified phenol resin, a polyvinylphenol, a naphtholaralkyl-based phenol resin, a biphenylaralkyl-based phenol resin, a naphthalene-based phenol resin and an aminotriazine novolac-based phenol resin. These may be used alone or in combination (two or more). Of them, in view of water absorbability and heat resistance, a cresol novolac-based phenol resin, an aminotriazine novolac-based phenol resin, a naphthalene-based phenol resin and a naphtholaralkyl-based phenol resin are preferred. In view of resistance to flame and drill processability, a biphenylaralkyl-based phenol resin is preferred, and a cresol novolac-based a phenol compound, a naphtholaralkyl-based phenol resin represented by the following formula (7) and a biphenylaralkyl-based phenol resin represented by the following formula (8) are more preferred.

(7)

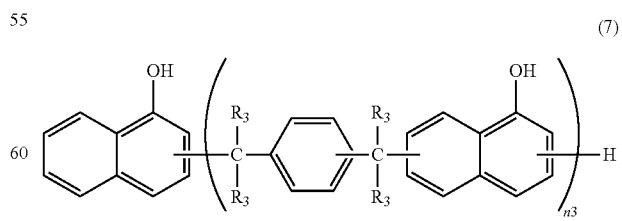

wherein $R_3$ each independently represent a hydrogen atom or a methyl group and n3 represents an integer of 1 or more (preferably 1 to 10).

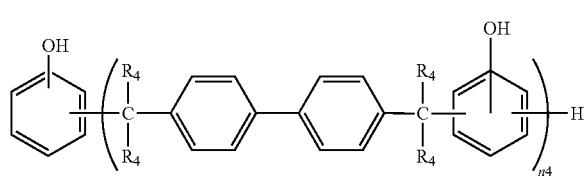

(8)

wherein $R_4$ represents a hydrogen atom or a methyl group and n4 represents an integer of 1 or more (preferably 1 to 10).

The ratio of the cyanate group equivalent of the cyanic acid ester compound (B) and/or the hydroxyl group equivalent of the phenol resin (C) to the epoxy group equivalent of an epoxy compound contained in the resin composition is preferably 0.3 to 0.7.

The ratio of equivalent used in the embodiment refers to the ratio of the equivalent of an epoxy compound such as a cyclic epoxy-modified silicone compound (A) and a non-halogen epoxy resin (E) and the equivalent of a cyanic acid ester compound (B) and/or a phenol resin, provided that the content of resin solid-matter in the resin composition of the embodiment is 100 parts by mass. More specifically, the ratio of equivalent is calculated by obtaining a total of values (which serves as a denominator) by dividing the contents of a cyclic epoxy-modified silicone compound (A) and a non-halogen epoxy resin (E) by the epoxy equivalents that the respective epoxy compounds intrinsically have (provided that the content of resin solid-matter in the resin composition of the embodiment is 100 parts by mass); and by obtaining a value (which serves as a numerator) by dividing the content of the cyanic acid ester compound (B) by the cyanate equivalent that the cyanic acid ester compound (B) intrinsically has and/or by dividing the content of the phenol resin (C) by the hydroxy-group equivalent that the phenol resin (C) intrinsically has (provided that the content of resin solid-matter in the resin composition is 100 parts by mass).

If the ratio (CN/Ep) of the number of cyanate groups contained in a cyanic acid ester compound (B) based on the number of epoxy groups contained in an epoxy compound in a resin composition falls within the above range, heat resistance, flame retardation and coefficient of water absorption are further improved. If the ratio (OH/Ep) of the number of phenol groups in a phenol resin (C) based on the number of epoxy groups in an epoxy resin falls within the above range, a further high glass transition temperature can be obtained; at the same time, flame retardation is further improved.

In the resin composition of the embodiment, the total content of a cyanic acid ester compound (B) and a phenol resin (C) based on the total amount (100 parts by mass) of a cyclic epoxy-modified silicone compound (A), a cyanic acid ester compound (B), a phenol resin (C) and a non-halogen epoxy resin (E) and a maleimide compound (F) contained as optional components is preferably 10 to 50 parts by mass and more preferably 20 to 40 parts by mass. If the total content of a cyanic acid ester compound (B) and phenol resin (C) falls within the above range, degree of cure, flame retardation, glass transition temperature, coefficient of water absorption and elastic modulus can be further improved.

An inorganic filler (D) is not particularly limited as long as it is usually used. Examples of the inorganic filler (D) may include silica such as natural silica, fused silica, amorphous silica and hollow silica; metal hydrates such as aluminium hydroxide, heat-treated aluminium hydroxide (aluminum hydroxide is heated to remove part of crystal water), boehmite and magnesium hydroxide; molybdenum compounds such as molybdenum oxide, zinc molybdate, and molybdenum acid compound coated with an inorganic oxide; zinc compounds such as zinc borate and zinc stannate; alumina, clay, kaolin, talc, calcined clay, calcined kaolin, calcined talc, mica, short glass fibers (fine glass powders such as E glass and D glass), hollow glass and spherical glass. These may be used alone or in combination (two or more).

Of them, in view of coefficient of thermal expansion and resistance to flame, silica, boehmite, magnesium hydroxide, alumina and talc are preferred; and boehmite and silica are more preferred. In view of drill processability, a molybdenum compound and a molybdenum acid compound coated with an inorganic oxide are preferred.

The average particle diameter ($D_{50}$) of an inorganic filler (D) is not particularly limited; however, in view of dispersibility, it is preferably 0.2 to 5 μm. The average particle diameter ($D_{50}$) refers to a median diameter (medium diameter), which is the particle diameter obtained when the particle size distribution of a powder is obtained and divided into two and the number of particles at the larger side and the number of particles at the smaller side occupy 50% of the number of particles of the entire powder. The average particle diameter ($D_{50}$) of the inorganic filler (D) is determined by a wet-process laser diffraction/scattering method.

The content of an inorganic filler (D) in the resin composition of the embodiment is not particularly limited; however, the content based on the total amount (100 parts by mass) of a cyclic epoxy-modified silicone compound (A), a cyanic acid ester compound (B), a phenol resin (C), and a non-halogen epoxy resin (E) and a maleimide compound (F) contained as optional components is preferably 50 to 500 parts by mass and more preferably 80 to 300 parts by mass. If the content of an inorganic filler (D) falls within the above range, flame retardation, moldability and drill processability are further improved.

In the aspect where the resin composition of the embodiment contains a BT resin (G), the content of an inorganic filler (D) based on the total amount (100 parts by mass) of a cyclic epoxy-modified silicone compound (A), a BT resin (G) and a non-halogen epoxy resin (E) contained as an optional component is preferably 50 to 500 parts by mass and more preferably 80 to 300 parts by mass. If the content of an inorganic filler (D) falls within the above range, flame retardation, moldability and drill processability are further improved.

In order to further improve dispersibility of an inorganic filler (D) in a resin composition and adhesive strength of a resin component to an inorganic filler (D) and a glass cloth, other additives such as a silane coupling agent and a wet dispersant can be used in combination with the inorganic filler (D).

The silane coupling agent is not particularly limited as long as it is a silane coupling agent generally used for a surface treatment of an inorganic substance. Specific examples of the silane coupling agent may include amino silane-based coupling agents such as γ-aminopropyltriethoxysilane and N-β-(aminoethyl)-γ-aminopropyltrimethoxysilane; epoxy silane-based coupling agents such as γ-glycidoxypropyltrimethoxysilane; vinylsilane-based coupling agents such as γ-metacryloxypropyltrimethoxysilane; cationic silane-based coupling agents such as N-β-(N-vinylbenzylaminoethyl)-γ-aminopropyltrimethoxysilane hydrochloride; and phenylsilane-based coupling agents. These may be used alone or in combination (two or more).

The wet dispersant is not particularly limited as long as it is a dispersion stabilizer used for paints. Specific examples of the wet dispersant may include wet dispersants under trade names of "Disperbyk-110", "Disperbyk-111", "Disperbyk-180", "Disperbyk-161", "BYK-W996", "BYK-W9010" and "BYK-W903" (manufactured by BYK).

In order to further reduce heat resistance and chemical resistance, it is preferable that the resin composition of the embodiment further contain a non-halogen epoxy resin (E). The non-halogen epoxy resin (E) is not particularly limited as long as it is an epoxy resin containing no halogen atom in a molecular structure. Preferable examples of the non-halogen epoxy resin (E) may include a phenolphenylaralkyl novolac-based epoxy resin represented by formula (9), a phenolbiphenylaralkyl-based epoxy resin represented by formula (10) and a naphtholaralkyl-based epoxy resin represented by formula (11).

In order to further reduce heat expansibility, preferable examples of the non-halogen epoxy resin (E) may include an anthraquinone-based epoxy resin represented by formula (12), a polyoxynaphthylene-based epoxy resin represented by formula (13) or formula (14), a bisphenol A-based epoxy resin, a bisphenol F-based epoxy resin, a phenol novolac-based epoxy resin, a cresol novolac-based epoxy resin, a bisphenol A novolac-based epoxy resin, a trifunctional phenol-based epoxy resin, a tetrafunctional phenol-based epoxy resin, a naphthalene-based epoxy resin, a biphenyl-based epoxy resin, an aralkyl novolac-based epoxy resin, an alicyclic epoxy resin, a polyol-based epoxy resin, a compound obtained by epoxylating a double bond of e.g., glycidylamine, glycidylester and butadiene, and a compound obtained by a reaction between a hydroxyl group-containing silicone resin and epichlorohydrin.

Of the above, in order to further improve particularly flame retardation, a phenolphenylaralkyl novolac-based epoxy resin represented by formula (9), a biphenylaralkyl-based epoxy resin represented by formula (10), a naphtholaralkyl-based epoxy resin represented by formula (11), an anthraquinone-based epoxy resin represented by formula (12) and a polyoxynaphthylene-based epoxy resin represented by formula (13) or formula (14) are more preferred.

These non-halogen based epoxy resins (E) may be used alone or in combination (two or more).

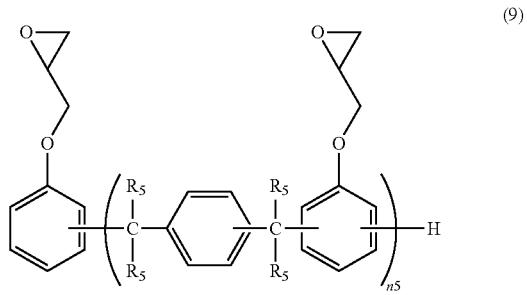

(9)

wherein $R_5$ each independently represent a hydrogen atom or a methyl group and n5 represents an integer of 1 or more (preferably 1 to 10).

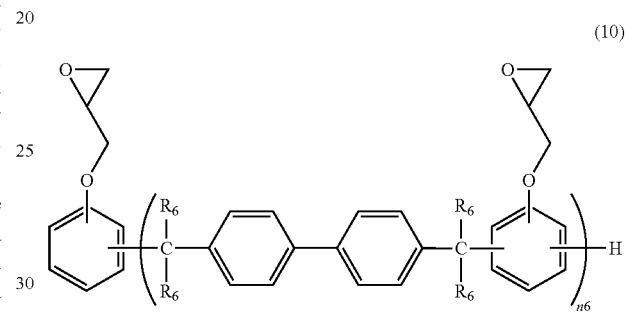

(10)

wherein $R_6$ each independently represent a hydrogen atom or a methyl group and n6 represents an integer of 1 or more (preferably 1 to 10).

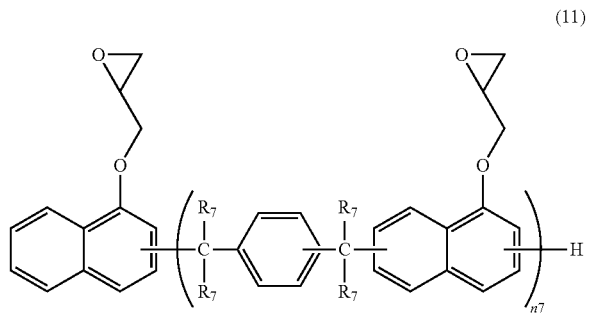

(11)

wherein $R_7$ each independently represent a hydrogen atom or a methyl group and n7 represents an integer of 1 or more (preferably 1 to 10).

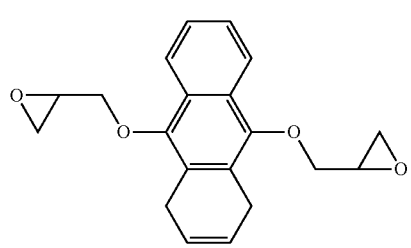

(12)

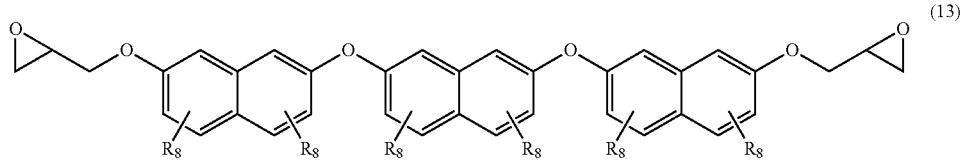

(13)

wherein $R_8$ each independently represent a hydrogen atom, an alkyl group or aralkyl group having 1 to 4 carbon atoms).

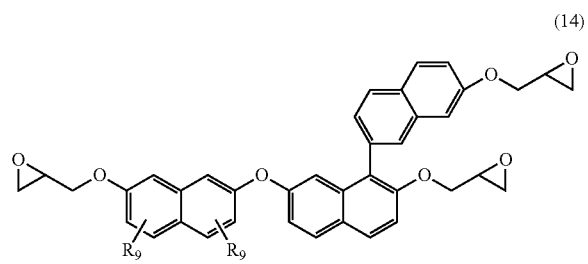

(14)

wherein $R_9$ each independently represent a hydrogen atom, an alkyl group or aralkyl group having 1 to 4 carbon atoms).

As a non-halogen epoxy resin (E) having a structure represented by the above formula (13) or formula (14), a commercially available product can be used. Examples of such a commercially available product may include products under trade names of "EXA-7311", "EXA-7311-G3", "EXA-7311-G4", "EXA-7311-G4S", "EXA-7311L" and "HP-6000" manufactured by DIC.

Depending upon the use desired, e.g., a phosphorus-containing epoxy resin and a brominated epoxy resin can be further used in combination. The brominated epoxy resin is not particularly limited as long as it is a bromine atom-containing compound having two or more epoxy groups in a single molecule. Specific examples of the brominated epoxy resin may include a brominated bisphenol A-based epoxy resin and a brominated phenol novolac-based epoxy resin.

In the resin composition of the embodiment, the content of the non-halogen epoxy resin (E) is not particularly limited; however, the content based on the total amount (100 parts by mass) of a cyclic epoxy-modified silicone compound (A), a cyanic acid ester compound (B), a phenol resin (C), a non-halogen epoxy resin (E) and a maleimide compound (F) contained as an optional component is preferably 5 to 60 parts by mass and more preferably 10 to 40 parts by mass. If the content of the non-halogen epoxy resin (E) falls within the above range, degree of cure, flame retardation, glass transition temperature, coefficient of water absorption and elastic modulus are further improved.

Furthermore, in the aspect where the resin composition of the embodiment contains a BT resin (G), the content of a non-halogen epoxy resin (E) based on the total amount (100 parts by mass) of a cyclic epoxy-modified silicone compound (A), a BT resin (G) and the non-halogen epoxy resin (E) is preferably 5 to 60 parts by mass and more preferably 10 to 40 parts by mass. If the content of the non-halogen epoxy resin (E) falls within the above range, degree of cure, flame retardation, glass transition temperature, coefficient of water absorption and elastic modulus are further improved.

In view of heat resistance, it is preferable that the resin composition of the embodiment further contain a maleimide compound (F). The maleimide compound (F) is not particularly limited as long as it has at least one maleimide group in a single molecule. Specific examples of the maleimide compound (F) may include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, a maleimide compound represented by formula (15), prepolymers of these maleimide compounds and prepolymers of these maleimide compounds and an amine compound. These may be used alone or in combination (two or more).

Of them, in view of heat resistance, bis(4-maleimidephenyl)methane, 2,2-bis{4-(4-maleimidephenoxy)-phenyl}propane, bis(3-ethyl-5-methyl-4-maleimidephenyl)methane and a maleimide compound represented by formula (15) are preferred and a maleimide compound represented by formula (15) is more preferred.

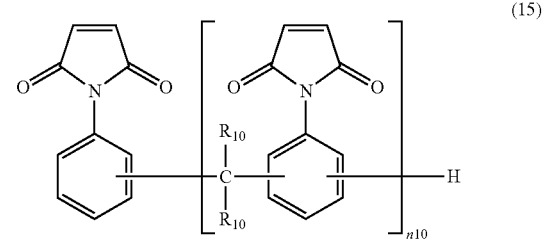

(15)

wherein $R_{10}$ each independently represent a hydrogen atom or a methyl group and n10 represents an integer of 1 or more (preferably 1 to 10).

In the resin composition of the embodiment, the content of a maleimide compound (F) is not particularly limited; however, the content based on the total amount (100 parts by mass) of a cyclic epoxy-modified silicone compound (A), a cyanic acid ester compound (B), a phenol resin (C), a non-halogen epoxy resin (E) and the maleimide compound (F) is preferably 5 to 50 parts by mass and more preferably 10 to 40 parts by mass. If the content of the maleimide compound (F) falls within the above range, degree of cure, flame retardation, glass transition temperature, coefficient of water absorption and elastic modulus are further improved.

The BT resin (G) refers to a bismaleimidetriazine resin and obtained, for example, by heating a cyanic acid ester compound and a maleimide compound in the absence of a solvent or after dissolving them in an organic solvent such as methylethylketone, N-methylpyrrolidone, dimethylformamide, dimethylacetamide, toluene and xylene and mixing them to obtain a polymer.

The cyanic acid ester compound to be used is not particularly limited. Examples thereof may include a naphtholaralkyl-based cyanic acid ester compound represented by formula (5), a novolac-based cyanic acid ester represented by formula (6), a biphenylaralkyl-based cyanic acid ester, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone and 2,2'-bis(4-cyanatophenyl)propane.

Of them, a naphtholaralkyl-based cyanic acid ester compound represented by formula (5), a novolac-based cyanic acid ester represented by formula (6) and a biphenylaralkyl-based cyanic acid ester are preferred in view of flame retardation, harden ability and low thermal expansivity, and a naphtholaralkyl-based cyanic acid ester compound represented by formula (5) and a novolac-based cyanic acid ester represented by formula (6) are more preferred.

Examples of the maleimide compound may include, but not particularly limited to, N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, a maleimide compound represented by formula (15), and prepolymers of these maleimide compounds or prepolymers of the maleimide compounds and an amine compound. These may be used alone or in combination (two or more).

Of them, bis(4-maleimidephenyl)methane, 2,2-bis{4-(4-maleimidephenoxy)-phenyl}propane, bis(3-ethyl-5-methyl-4-maleimidephenyl)methane and a maleimide compound represented by formula (15) are preferred and a maleimide compound represented by formula (15) is more preferred.

The content of the maleimide compound (F) in a BT resin (G) is not particularly limited; however, in view of glass transition temperature, flame retardation and harden ability, the content based on the total amount of the BT resin (G) is preferably 5 to 75 mass % and more preferably 10 to 70 mass %.

Furthermore, the number average molecular weight of a BT resin (G) as a prepolymer is not particularly limited; however, in view of handling, glass transition temperature and harden ability, the number average molecular weight is preferably 100 to 100000, more preferably 200 to 50000 and further preferably 300 to 10000. The number average molecular weight is determined by gel permeation chromatography.

The value (which serves as a numerator) is obtained by dividing the content of the cyanic acid ester compound to be used in a BT resin (G) by the cyanate equivalent that a cyanic acid ester compound (B) intrinsically has. Provided that the content of resin solid-matter in the resin composition of the embodiment is 100 parts by mass, a total of values (which serves as a denominator) is obtained by dividing the contents of a cyclic epoxy-modified silicone compound (A) and a non-halogen epoxy resin (E) by the epoxy equivalents that the respective epoxy compounds intrinsically have. The ratio of equivalent, which is obtained from the numerator and denominator, is preferably 0.3 to 2.0 and more preferably 0.3 to 0.7. If the ratio of equivalent falls within the above range, heat resistance, chemical resistance, flame retardation and coefficient of water absorption are further improved.

In the resin composition of the embodiment, the content of a BT resin (G) is not particularly limited; however, the content based on the total amount (100 parts by mass) of a cyclic epoxy-modified silicone compound (A), a BT resin (G) and a non-halogen epoxy resin (E) contained as an optional component is preferably 20 to 80 parts by mass and more preferably 30 to 70 parts by mass. If the content of BT resin (G) falls within the above range, degree of cure, flame retardation, glass transition temperature, coefficient of water absorption and elastic modulus are further improved.

It is preferable that the resin composition of the embodiment further contain an imidazole compound (H) represented by formula (16), as a hardening accelerator. If such an imidazole compound (H) is further contained, hardening can be accelerated and the glass transition temperature of a hardened material can be increased.

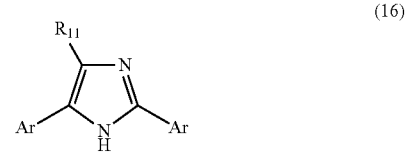

(16)

In the formula (16), Ar each independently represent one selected from the group consisting of a phenyl group, a naphthalene group, a biphenyl group, an anthracene group, or these groups modified with a hydroxyl group; $R_{11}$ represents a hydrogen atom, an alkyl group, an alkyl group modified with a hydroxyl group or an aryl group.

In the formula, examples of substituent Ar may include a phenyl group, a naphthalene group, a biphenyl group, an anthracene group and these modified with a hydroxyl group. Of them, a phenyl group is preferred.

In the formula, examples of substituent $R^{11}$ may include a hydrogen atom, an alkyl group, an alkyl group modified with a hydroxyl group and an aryl group such as a phenyl group. Of them, a phenyl group is preferred as the Ar group and $R^{11}$ group.

Examples of the imidazole compound (H) may include, but not particularly limited to, an imidazole compound represented by the above formula (16) and 2-ethyl-4-methyl imidazole.

In the formula (16), Ar each independently represent a phenyl group, a naphthalene group, a biphenyl group, an anthracene group or a hydroxyl group-modified group thereof. Of them, a phenyl group is preferred.

$R_{11}$ is a hydrogen atom, an alkyl group or a hydroxyl group-modified group thereof, an aryl group such as a phenyl group. Of them, a phenyl group is preferred as both Ar and $R_{11}$.

Preferable examples of the imidazole compound (H) may include, but not particularly limited to, 2,4,5-triphenylimidazole and 2-phenyl-4-methylimidazole. If such an imidazole compound (H) is used, harden ability is more improved and the glass transition temperature of a hardened material is likely to be more improved.

In the resin composition of the embodiment, the content of an imidazole compound (H) is not particularly limited; however, the content based on the total amount (100 parts by mass) of a cyclic epoxy-modified silicone compound (A), a cyanic acid ester compound (B), a phenol resin (C), a non-halogen epoxy resin (E) and a maleimide compound (F) contained as optional components is preferably 0.01 to 10 parts by mass and more preferably 0.1 to 5 parts by mass. If the content of an imidazole compound (H) falls within the above range, degree of cure, glass transition temperature, coefficient of water absorption and elastic modulus are further improved.

Furthermore, in the aspect where the resin composition of the embodiment contains a BT resin (G), the content of an imidazole compound (H) based on the total amount (100 parts by mass) of a cyclic epoxy-modified silicone compound (A), a BT resin (G) and a non-halogen epoxy resin (E) contained as an optional component is preferably 0.01 to 10 parts by mass, and more preferably 0.1 to 5 parts by mass. If the content of an imidazole compound (H) falls within the above range, degree of cure, glass transition temperature, coefficient of water absorption and elastic modulus are further improved.

In the embodiment, as long as desired properties are not damaged, another hardening accelerator can be used in combination with the above imidazole compound (H). Examples of such a compound may include organic peroxides such as benzoyl peroxide, lauroyl peroxide, acetyl peroxide, parachlorobenzoyl peroxide and di-tert-butyl-diperphthalate; azo compounds such as azobisnitrile; tertiary amines such as N,N-dimethylbenzylamine, N,N-dimethylaniline, N,N-dimethyltoluidine, 2-N-ethylanilino ethanol, tri-n-butylamine, pyridine, quinoline, N-methylmorpholine, triethanolamine, triethylenediamine, tetramethylbutanediamine and N-methylpiperidine; phenols such as phenol, xylenol, cresol, resorcin and catechol; organic metal salts such as lead naphthenate, lead stearate, zinc naphthenate, zinc octylate, tin oleate, dibutyltin malate, manganese naphthenate, cobalt naphthenate and iron acetylacetonate; compounds obtained by dissolving these organic metal salts in a hydroxyl group containing compound such as phenol or bisphenol; inorganic metal salts such as tin chloride, zinc chloride and aluminum chloride; and organic tin compounds such as dioctyltin oxide, other alkyl tin, alkyltin oxides.

In the embodiment, as long as desired properties are not damaged, a silicone powder may be further contained. The silicone powder serves, for example, as a flame retardant promoter which retards combustion time and improves a flame-retardant effect.

Examples of the silicone powder may include, a pulverized polymethylsilsesquioxane in which a siloxane bond is crosslinked like a three-dimensional reticulate; a pulverized polymer obtained by addition-polymerization of a vinyl group-containing dimethylpolysiloxane and methyl hydrogen polysiloxane; a pulverized polymer obtained by addition-polymerization of a vinyl group-containing dimethylpolysiloxane and methyl hydrogen polysiloxane, coated with a polymethylsilsesquioxane, in which a siloxane bond is crosslinked like a three-dimensional reticulate; and an inorganic carrier coated with a polymethylsilsesquioxane, in which a siloxane bond is crosslinked like a three-dimensional reticulate.

The average particle diameter ($D_{50}$) of a silicone powder is not particularly limited; however, in view of dispersibility, the average particle diameter ($D_{50}$) is preferably 1 to 15 μm. The average particle diameter ($D_{50}$) of a silicone powder can be determined in accordance with the method for determining the average particle diameter ($D_{50}$) of an inorganic filler (D).

The content of a silicone powder is not particularly limited; however the content based on total (100 parts by mass) of a cyclic epoxy-modified silicone compound (A), a cyanic acid ester compound (B), a phenol resin (C), a non-halogen epoxy resin (E) and a maleimide compound (F) contained as an optional component is preferably 3 to 120 parts by mass and more preferably 5 to 80 parts by mass. If the content of a silicone powder falls within the above range, flame retardation as the effect of a flame retardant promoter can be further improved. Furthermore, since a component having low hardness is blended, drill processability can be further improved. Moreover, since addition of an excessive amount of silicone powder is avoided, moldability can be further improved.

Furthermore, in the aspect where the resin composition of the embodiment contains a BT resin (G), the content based on the total amount (100 parts by mass) of a cyclic epoxy-modified silicone compound (A), a BT resin (G) and a non-halogen epoxy resin (E) is preferably 3 to 120 parts by mass and more preferably 5 to 80 parts by mass. If the content of a silicone powder falls within the above range, flame retardation as the effect of a flame retardant promoter can be further improved. Furthermore, since a component having low hardness is blended, drill processability can be further improved. Moreover, since addition of an excessive amount of silicone powder is avoided, moldability can be further improved.

The resin composition of the embodiment may contain a solvent, if necessary. If an organic solvent is used, for example, viscosity can be reduced in preparing a resin composition. As a result, handling is further improved; at the same time, impregnation to e.g., glass cloth can be further improved. The kind of solvent is not particularly limited, as long as it dissolves components used in a resin composition. Specific examples of the solvent may include, but not particularly limited to, ketones such as acetone, methylethylketone and methylcellosolve; aromatic hydrocarbons such as toluene and xylene; amides such as dimethylformamide, propylene glycol methyl ether and an acetate thereof. The solvents may be used alone or in combination (two or more).

In the embodiment, the resin composition can be prepared in accordance with a customary method, for example, by a method of stirring components constituting a resin composition so as to obtain a homogeneous state. More specifically, the resin composition of the embodiment can be prepared by blending a cyclic epoxy-modified silicone compound (A), a cyanic acid ester compound (B) and/or a phenol resin (C), an inorganic filler (D) and the aforementioned optional components, if necessary, with a solvent and sufficiently stirring the mixture. Furthermore, in the aspect where the resin composition of the embodiment contains a BT resin (G), the resin composition of the embodiment can be prepared, for example, by sequentially blending a cyclic epoxy-modified silicone compound (A), a cyanic acid ester compound (B) and silica, if necessary, with a solvent, and sufficiently stirring the mixture.

In preparing the resin composition of the embodiment, if necessary, a solvent such as an organic solvent can be used. The kind of organic solvent is not particularly limited as long as the components to be used can be dissolved. Specific examples of the solvent that can be used herein are defined as the same as described in the aforementioned specific examples.

Note that in preparing the resin composition of the embodiment, for homogeneously dissolving or dispersing components, a process known in the art (e.g., stirring, mixing, kneading process) can be applied. For example, in homogeneously dispersing an inorganic filler (D), etc., a mixing vessel equipped with a stirrer having an appropriate stirring ability can be used. If a stirring dispersion process is carried out by use of such a mixing vessel, the dispersibility of a resin composition can be increased. The stirring, mixing, kneading process mentioned above, can be appropriately performed by use of, for example, an apparatus for mixing, such as a ball mill and beads mill or a known apparatus such as revolution/self-rotation mixing apparatus.

Various substrates are impregnated with the resin composition of the embodiment or coated with the resin composition to obtain prepregs. As a preferable aspect of a prepreg, a prepreg having the above resin composition and a substrate impregnated or coated with the resin composition, is mentioned. A method for preparing a prepreg is not particularly limited, and a customary method can be also employed. For example, a method having a step of impregnating or coating a substrate with the above resin composition and, e.g., heating the substrate in a dryer of 100 to 200° C. for 1 to 30 minutes to obtain a semi-cured state (B stage), is mentioned. In this way, a prepreg of the embodiment can be prepared.

Note that, the content of a resin composition based on the total amount of prepreg is preferably 30 to 90 mass %, more preferably 35 to 80 mass % and further preferably 40 to 75 mass %.

The material for a substrate is not particularly limited and can be appropriately selected from known materials used as materials for various types of printed-wiring boards depending upon the desired application and performance and put in use. Specific examples of the substrate may include, is not particularly limited to, glass fibers such as E glass cloth, D glass cloth, S glass cloth, Q glass cloth, spherical glass, NE glass and T glass; inorganic fibers other than glass such as quartz; and organic fibers such as wholly aromatic polyamides including a poly(paraphenylene terephthalamide) (Keviar (registered trade mark), manufactured by Du Pont), a co-poly(paraphenylene 3,4'-oxydiphenylene terephthalamide) (Technora (registered trade mark), Teijin Techno Products Limited Company); polyesters including 2,6-hydroxynaphthoic acid parahydroxybenzoic acid (Vectran (registered trade mark), manufactured by Kuraray Co., Ltd.); and polyimides including polyparaphenylenebenzoxazole (Zylon (registered trade mark), manufactured by Toyobo Co., Ltd.).

Examples of a sheet-form substrate may include organic films such as a polyethylene film, a polypropylene film, a polycarbonate film, a polyethylene terephthalate film, an ethylene-tetrafluoroethylene copolymer film, a parting film obtained by coating the surface of each of these films with a parting agent and a polyimide film.

Of them, in view of low thermal expansibility, at least one selected from the group consisting of E glass cloth, T glass cloth, S glass cloth, Q glass cloth, an organic fiber and an organic film is preferred. These substrates may be used alone or in combination (two or more).

Examples of the shape of the substrate, may include, but not limited to, woven cloth, nonwoven cloth, roving, chopped strand mat and surfacing mat. Examples of the woven cloth may include a plane-weave cloth, a mat-weave cloth and a twill-weave cloth. A cloth can be appropriately selected depending upon a desired purpose and performance. For example, woven fabrics which are previously subjected to an opening treatment and glass woven fabrics surface-treated with a silane coupling agent are suitably used.

The thickness of the substrate is not particularly limited; however, it is preferable that the thickness be usually about 0.01 to 0.3 mm. Particularly in view of strength and water absorbability, the substrate is preferably a glass woven fabric having a thickness of 200 μm or less and a mass of 250 g/m$^2$ or less and more preferably a glass woven fabric formed of E glass fiber.

A metal foil-clad laminate can be formed by laminating a metal foil on the prepreg of the embodiment. More specifically, the metal foil-clad laminate of the embodiment is a metal foil-clad laminate having the prepreg mentioned above and a metal foil laminated on the prepreg. The metal foil-clad laminate of the embodiment has low coefficient of thermal expansion, high flame retardation, satisfactory moldability and drill processability, and thus, particularly suitable for a printed-wiring board for semiconductor package requiring such performances.

A metal foil-clad laminate can be obtained, for example, by laminating at least one prepreg as mentioned above, arranging a metal foil to one surface or both surfaces of the prepreg and laminating/molding the resultant prepreg. More specifically, the metal foil-clad laminate of the embodiment can be manufactured by obtaining a construct, which is formed by using a single prepreg or laminating a plurality of prepregs as mentioned above, and, if desired, arranging a meal foil of e.g., copper and aluminum foil on one surface or both surfaces of the laminate and, if necessary laminating and molding this construct.

Alternatively, the metal foil-clad laminate of the embodiment may be formed by laminating a prepreg and a metal foil and curing the prepreg. In this case, the metal foil-clad laminate has a prepreg and a metal foil laminated on the prepreg, in which the prepreg is cured.

The metal foil is not particularly limited as long as it is used, for example, as a material for a printed-wiring board; however, a rolled copper foil and an electrolytic copper foil are preferred. The thickness of the metal foil is not particularly limited; however, the thickness is preferably 2 to 70 μm and more preferably 2 to 35 μm. A method for molding a metal foil-clad laminate and molding conditions thereof are not particularly limited; however, a method and molding conditions for molding a laminate for general printed-wiring board and multilayer for printed-wiring board can be applied. For example, in molding a metal foil-clad laminate, e.g., a multistage press machine, a multistage vacuum press machine, a continuous molding machine and an autoclave molding machine can be used. A molding temperature of 100 to 300° C., a molding pressure (contact pressure) of 2 to 100 kgf/cm$^2$, and heating time within the range of 0.05 to 5 hours are generally employed. If necessary, post curing can be made at a temperature of 150 to 300° C. Alternatively, a metal foil-clad laminate can be formed by laminating a wiring board for inner layer separately formed on a prepreg as mentioned above.

If the resin composition of the embodiment is used as an insulating layer, a printed-wiring board can be realized. Alternatively, if a predetermined wiring pattern is formed on the aforementioned metal foil-clad laminate of the embodiment, it can be suitably used as a printed-wiring board. More specifically, the printed-wiring board of the embodiment is a printed-wiring board having an insulating layer having the above resin composition and a conductive layer formed on a surface of the insulating layer. The printed-wiring board of the embodiment will have excellent flame retardation, heat resistance and drill processability and low coefficient of thermal expansion.

The insulating layer is not particularly limited as long as it is a layer containing the resin composition of the embodiment. For example, the prepreg of the embodiment is mentioned. The conductive layer is not particularly limited and, for example, a layer formed of the metal foil of a metal foil-clad laminate is mentioned.

A method for manufacturing the printed-wiring board of the embodiment will be described, below.

At the first place, the metal foil-clad laminate of the embodiment is prepared. The metal foil-clad laminate is prepared by at least using the resin composition of the embodiment and, for example, constituted of a prepreg and a metal foil laminated thereon.

Then, the surface of the metal foil-clad laminate is subjected to an etching treat to form an inner layer circuit. In this way, an inner-layer substrate is obtained. The surface of the inner layer circuit of the inner-layer substrate is, if necessary, treated in order to enhance adhesive strength. Subsequently, on the surface of the inner layer circuit, a required number of prepregs of the embodiment are laminated and a metal foil for an outer-layer circuit is laminated further on the outer side thereof. The resultant laminate is heated and pressurized to mold into one. In this manner, a multilayer laminate having an insulating layer formed of cured prepreg formed between the metal foil for an inner-layer circuit and the metal foil for an outer-layer circuit is obtained.

Subsequently, the multilayer laminate is drilled for forming through-holes and via-holes and a metal film is formed by plating on the wall surfaces of the holes for conducting metal foils of the inner-layer circuit and the outer-layer circuit. Further, the metal foil for the outer-layer circuit is subjected to an etching treatment to form the outer-layer circuit. In this manner, a printed-wiring board is manufactured. In this process, the aforementioned resin composition, prepreg (substrate and the resin composition of the embodiment added thereto), the resin composition layer of the metal foil-clad laminate (layer formed of the resin composition of the embodiment) constitute an insulating layer containing the resin composition.

EXAMPLES

Now, the present invention will be more specifically described by way of Examples and Comparative Examples; however, the present invention is not particularly limited by the following Examples.

Synthesis Example 1: Synthesis of α-naphtholaralkyl-Based Cyanic Acid Ester Compound A reactor equipped with a thermometer, a stirrer, a dripping funnel and a reflux condenser was previously cooled with brine to 0 to 5° C. The reactor was charged with cyan chloride (7.47 g (0.122 mol)), 35% hydrochloric acid (9.75 g (0.0935 mol)), water (76 mL) and methylene chloride (44 mL).

While maintaining a reaction solution in the reactor, at a temperature of −5 to +5° C. and at pH of 1 or less and stirring, a solution obtained by dissolving α-naphtholaralkyl-based phenol resin (trade name "SN485", manufactured by Nippon Steel Chemical Co., Ltd., hydroxy group equivalent: 214 g/eq., softening point: 86° C.) (20 g (0.0935 mol) represented by formula (7) wherein $R_3$ are all hydrogen atoms and triethylamine (14.16 g (0.14 mol)) in methylene chloride (92 mL) was added dropwise by a dropping funnel over one hour.

After completion of the dropwise addition, triethylamine (4.72 g (0.047 mol)) was further added dropwise to the reaction solution over 15 minutes.

After completion of the dropwise addition, the reaction solution was stirred for 15 minutes at the same temperature and separated and the organic layer was obtained. The obtained organic layer was washed twice with water (100 mL) and then methylene chloride was distilled away under reduced pressure by use of an evaporator. The residue was further concentrated and dried at 80° C. for one hour to obtain 23.5 g of a cyanic acid ester compound of α-naphthol aralkyl resin (α-naphtholaralkyl-based cyanic acid ester compound, cyanate equivalent: 261 g/eq.).

Synthesis Example 2: Synthesis of BT Resin 1

The α-naphtholaralkyl-based cyanic acid ester compound (cyanate equivalent: 261 g/eq.) (36 parts by mass) obtained in Synthesis Example 1 and a maleimide compound (trade name, "BMI-2300", manufactured by Daiwa Fine Chemicals Co., Ltd., a mixture of a compound represented by formula (15) wherein $R_{10}$ are all hydrogen atoms and n10=2 and a compound represented by formula (15) wherein $R_{10}$ are all hydrogen atoms and n10=3) (26 parts by mass) were dissolved in dimethylacetamide and allowed to react at 150° C. while stirring to obtain BT resin 1.

Synthesis Example 3: Synthesis of BT Resin 2

The α-naphtholaralkyl-based cyanic acid ester compound (cyanate equivalent: 261 g/eq.) (30 parts by mass) obtained in Synthesis Example 1 and the maleimide compound (trade name, "BMI-2300") (30 parts by mass) used in Synthesis Example 2 were dissolved in dimethylacetamide and allowed to react at 150° C. while stirring to obtain BT resin 2.

Hydroxy group equivalent, cyanate group equivalent and epoxy-group equivalent were determined by titration in accordance with JIS K7236: 2001. The softening point was measured in accordance with JIS K7206.

Example 1

Cyclic epoxy-modified silicone resin 1 (trade name, "X-40-2670", manufactured by Shin-Etsu Chemical Co., Ltd., epoxy equivalent: 185 g/eq.) (17 parts by mass) represented by formula (2); a polyoxynaphthylene-based epoxy resin (trade name, "HP-6000", manufactured by DIC, epoxy equivalent: 250 g/eq.) (27 parts by mass); a naphtholaralkyl-based phenol resin (trade name, "SN-495", manufactured by Nippon Steel Chemical Co., Ltd., hydroxy group equivalent: 236 g/eq.) (36 parts by mass) represented by formula (7) wherein $R_3$ are all hydrogen atoms; an aminotriazine novolac resin (trade name, "PHENOLITE LA-3018-50P", manufactured by DIC, hydroxy group equivalent: 151 g/eq.) (3 parts by mass); bis(3-ethyl-5-methyl-4-maleimidephenyl) methane (trade name, "BMI-70", manufactured by K-I Chemical Industry Co., Ltd.) (17 parts by mass); a silane coupling agent (trade name, "Z6040", manufactured by Dow Corning Toray Co., Ltd.) (5 parts by mass); wet dispersant 1 (trade name, "disperbyk-161", manufactured by BYK) (1 part by mass); spherical fused silica (trade name, "SC2500-SQ", manufactured by Admatechs, particle diameter: 0.5 μm) (150 parts by mass); and 2-ethyl-4-methylimidazole (trade name, "2E4MZ", manufactured by Shikoku Chemicals Corp.) (0.02 parts by mass) were mixed to obtain a varnish. The ratio of hydroxy group equivalent/epoxy equivalent of the varnish was 0.86. The varnish was diluted with methylethylketone and S glass woven cloth having a thickness of 0.1 mm was impregnated with the diluted varnish, dried by heating at 140° C. for 3 minutes to obtain a prepreg having a resin content of 46 mass %.

Example 2

A prepreg was obtained in the same manner as in Example 1 except that a phenylaralkyl-based phenol resin (trade name, "KAYAHARD GPH-103", manufactured by Nippon Kayaku Co., Ltd., hydroxy group equivalent: 231 g/eq.) (18 parts by mass) and a naphthalene skeleton-based phenol resin (trade name, "EPICLON EXB-9500", manufactured by DIC, hydroxy group equivalent: 153 g/eq.) (18 parts by mass) were used in place of the naphtholaralkyl-based phenol resin. Note that the ratio of hydroxy group equivalent/epoxy equivalent of the varnish was 1.08.

Example 3

A prepreg was obtained in the same manner as in Example 2 except that cyclic epoxy-modified silicone resin 2 (trade name, "X-40-2705", manufactured by Shin-Etsu Chemical Co., Ltd., epoxy equivalent: 212 g/eq.) (17 parts by mass) represented by formula (3) was used as a cyclic epoxy-modified silicone resin. Note that the ratio of hydroxy group equivalent/epoxy equivalent of the varnish was 1.15.

Example 4

A prepreg was obtained in the same manner as in Example 2 except that cyclic epoxy-modified silicone resin 3 (trade name, "X-40-2701", manufactured by Shin-Etsu Chemical Co., Ltd., epoxy equivalent: 177 g/eq.) (17 parts by mass) represented by formula (4) was used as a cyclic epoxy-modified silicone resin. Note that the ratio of hydroxy group equivalent/epoxy equivalent of the varnish was 1.05.

Example 5

Cyclic epoxy-modified silicone resin 1 (17 parts by mass); polyoxynaphthylene-based epoxy resin (trade name, "HP-6000") (21 part by mass); the α-naphtholaralkyl-based cyanic acid ester compound (cyanate equivalent: 261 g/eq.) (36 parts by mass) obtained by Synthesis Example 1; the maleimide compound (trade name, "BMI-2300") (26 parts by mass) used in Synthesis Example 2; a silane coupling agent (trade name, "Z6040") (5 parts by mass); a wet dispersant 1 (trade name, "disperbyk-161", manufactured by BYK) (1 part by mass); wet dispersant 2 (trade name, "disperbyk-111", manufactured by BYK) (2 parts by mass); a spherical fused silica (trade name, "SC2500-SQ") (200 parts by mass); and 2,4,5-triphenylimidazole (manufactured by Wako Pure Chemical Industries Ltd.) (1 part by mass) represented by formula (16) wherein $R_{10}$ and Ar are all phenyl groups were mixed to obtain a varnish. The ratio of cyanate group equivalent/epoxy equivalent of the varnish was 0.78. The varnish was diluted with methylethylketone and S glass woven cloth having a thickness of 0.1 mm was impregnated with the diluted varnish, dried by heating at 140° C. for 3 minutes to obtain a prepreg having a resin content of 46 mass %.

Example 6

A prepreg was obtained in the same manner as in Example 5 except that the content of cyclic epoxy-modified silicone resin 1 was set to be 25 parts by mass and the content of the polyoxynaphthylene-based epoxy resin (trade name, "HP-6000", epoxy equivalent 250 g/eq.) was set to be 13 parts by mass. Note that the ratio of cyanate group equivalent/epoxy equivalent of the varnish was 0.74.

Example 7

A prepreg was obtained in the same manner as in Example 5 except that BT resin 1 obtained in Synthesis Example 2 (62 parts by mass) was used in place of the α-naphtholaralkyl-based cyanic acid ester compound and the maleimide compound. Note that the ratio of cyanate group equivalent/epoxy equivalent of the varnish was 0.81.

Example 8

A prepreg was obtained in the same manner as in Example 5 except that BT resin 2 (66 parts by mass) obtained in Synthesis Example 3 was used in place of the α-naphtholaralkyl-based cyanic acid ester compound and the maleimide compound and the content of a polyoxynaphthylene-based epoxy resin (trade name, "HP-6000") was set to be 17 parts by mass. Note that the ratio of cyanate group equivalent/epoxy equivalent of the varnish was 0.79.

Example 9

A prepreg was obtained in the same manner as in Example 5 except that cyclic epoxy-modified silicone resin 2 (17 parts by mass) was used in place of cyclic epoxy-modified silicone resin 1. Note that the ratio of cyanate group equivalent/epoxy equivalent of the varnish was 0.84.

Example 10

A prepreg was obtained in the same manner as in Example 5 except that cyclic epoxy-modified silicone resin 3 (17 parts by mass) was used in place of cyclic epoxy-modified silicone resin 1. Note that the ratio of cyanate group equivalent/epoxy equivalent of the varnish was 0.76.

Example 11

A prepreg was obtained in the same manner as in Example 5 except that the amount of spherical fused silica (trade name, "SC2500-SQ") was changed to 250 parts by mass. Note that the ratio of cyanate group equivalent/epoxy equivalent of the varnish was 0.78.

Example 12

A prepreg was obtained in the same manner as in Example 11 except that a silicone rubber powder coated with a silicone resin (trade name, "KMP-600", silicone composite powder, manufactured by Shin-Etsu Chemical Co., Ltd.) (10 parts by mass) was used as an additional component. Note that the ratio of cyanate group equivalent/epoxy equivalent of the varnish was 0.78.

Example 13

A prepreg was obtained in the same manner as in Example 11 except that the amount of spherical fused silica (trade name, "SC2500-SQ") was changed to 300 parts by mass. Note that the ratio of cyanate group equivalent/epoxy equivalent of the varnish was 0.78.

Example 14

A prepreg was obtained in the same manner as in Example 11 except that the amount of spherical fused silica (trade name, "SC2500-SQ") was changed to 400 parts by mass and S glass woven cloth having a thickness of 0.70 mm was impregnated so as to obtain a resin content of 62 mass %.

Note that the ratio of cyanate group equivalent/epoxy equivalent of the varnish was 0.78.

Example 15

A prepreg was obtained in the same manner as in Example 2 except that Q glass woven cloth was impregnated in place of S glass woven cloth (the ratio of hydroxy group equivalent/epoxy equivalent of the varnish was 1.08).

Example 16

A prepreg was obtained in the same manner as in Example 3 except that Q glass woven cloth was impregnated in place of S glass woven cloth (the ratio of hydroxy group equivalent/epoxy equivalent of the varnish was 1.15).

Example 17

A prepreg was obtained in the same manner as in Example 4 except that Q glass woven cloth was impregnated in place of S glass woven cloth (the ratio of hydroxy group equivalent/epoxy equivalent of the varnish was 1.05).

Comparative Example 1

A prepreg was obtained in the same manner as in Example 2 except that cyclic epoxy-modified silicone resin 1 was not used, the polyoxynaphthylene-based epoxy resin (trade name, "HP-6000") (44 parts by mass) was used.

Comparative Example 2

A prepreg was obtained in the same manner as in Example 1 except that non-cyclic epoxy-modified silicone resin 1 (trade name, "X-22-163A", manufactured by Shin-Etsu Chemical Co., Ltd., both terminals were modified with epoxy, epoxy equivalent: 1000 g/eq.) (17 parts by mass) was used in place of cyclic epoxy-modified silicone resin 1.

Comparative Example 3

A prepreg was obtained in the same manner as in Example 2 except that non-cyclic epoxy-modified silicone resin 1 (trade name, "X-22-163A", manufactured by Shin-Etsu Chemical Co., Ltd.) (17 parts by mass) was used in place of cyclic epoxy-modified silicone resin 1.

Comparative Example 4

A prepreg was obtained in the same manner as in Example 2 except that non-cyclic epoxy-modified silicone resin 2 (trade name, "X-22-163B", manufactured by Shin-Etsu Chemical Co., Ltd., both terminals were modified with epoxy, epoxy equivalent: 1750 g/eq.) (17 parts by mass) was used in place of cyclic epoxy-modified silicone resin 1.

Comparative Example 5

A prepreg was obtained in the same manner as in Example 2 except that epoxy-modified silicone resin 3 (trade name, "X-22-169AS", manufactured by Shin-Etsu Chemical Co., Ltd., both terminals were modified with alicyclic epoxy, epoxy equivalent: 500 g/eq.) (17 parts by mass) was used in place of cyclic epoxy-modified silicone resin 1.

Comparative Example 6

A prepreg was obtained in the same manner as in Example 2 except that non-cyclic epoxy-modified silicone resin 4 (trade name, X-41-1053", manufactured by Shin-Etsu Chemical Co., Ltd., both terminals were modified with epoxy, epoxy equivalent: 820 g/eq.) (17 parts by mass) was used in place of cyclic epoxy-modified silicone resin 1.

Comparative Example 7

A prepreg was obtained in the same manner as in Example 2 except that non-cyclic epoxy-modified silicone resin 5 (trade name, "KF105", manufactured by Shin-Etsu Chemical Co., Ltd., both terminals were modified with epoxy, epoxy equivalent: 490 g/eq.) (17 parts by mass) was used in place of cyclic epoxy-modified silicone resin 1.

Comparative Example 8

A prepreg was obtained in the same manner as in Example 5 except that cyclic epoxy-modified silicone resin 1 was not used and polyoxynaphthylene-based epoxy resin (trade name, "HP-6000") (38 parts by mass) was used.

Comparative Example 9

A prepreg was obtained in the same manner as in Example 5 except that non-cyclic epoxy-modified silicone resin 1 (trade name, "X-22-163A") (17 parts by mass) was used in place of cyclic epoxy-modified silicone resin 1.

Comparative Example 10

A prepreg was obtained in the same manner as in Example 7 except that non-cyclic epoxy-modified silicone resin 1 (trade name, "X-22-163A") (17 parts by mass) was used in place of cyclic epoxy-modified silicone resin 1.

Comparative Example 11

A prepreg was obtained in the same manner as in Example 8 except that non-cyclic epoxy-modified silicone resin 1 (trade name, "X-22-163A") (17 parts by mass) was used in place of cyclic epoxy-modified silicone resin 1.

Comparative Example 12

A prepreg was obtained in the same manner as in Example 5 except that non-cyclic epoxy-modified silicone resin 2 (trade name, "X-22-163B") (17 parts by mass) was used in place of cyclic epoxy-modified silicone resin 1.

Comparative Example 13

A prepreg was obtained in the same manner as in Example 5 except that epoxy-modified silicone resin 3 (trade name, "X-22-169AS, both terminals were modified with alicyclic epoxy) (17 parts by mass) was used in place of cyclic epoxy-modified silicone resin 1.

Comparative Example 14

A prepreg was obtained in the same manner as in Example 5 except that non-cyclic epoxy-modified silicone resin 4 (trade name, "X-41-1053") (17 parts by mass) was used in place of cyclic epoxy-modified silicone resin 1.

Comparative Example 15

A prepreg was obtained in the same manner as in Example 5 except that non-cyclic epoxy-modified silicone resin 5

(trade name, "KF105") (17 parts by mass) was used in place of cyclic epoxy-modified silicone resin 1.

Example 18

A varnish was obtained by mixing cyclic epoxy-modified silicone resin 1 (trade name, "X-40-2670", manufactured by Shin-Etsu Chemical Co., Ltd., epoxy equivalent: 185 g/eq.) (17 parts by mass) represented by formula (2); a polyoxynaphthylene-based epoxy resin (trade name, "HP-6000", manufactured by DIC, epoxy equivalent: 250 g/eq.) (38 parts by mass); a naphtholaralkyl-based phenol resin (trade name, "SN-495", manufactured by Nippon Steel Chemical Co., Ltd., hydroxy group equivalent: 236 g/eq.) (25 parts by mass) represented by formula (7) wherein $R_3$ are all hydrogen atoms; an aminotriazine novolac resin (trade name, "PHENOLITE LA-3018-50P", manufactured by DIC, hydroxy group equivalent: 151 g/eq.) (3 parts by mass); bis(3-ethyl-5-methyl-4-maleimidephenyl)methane (trade name, "BMI-70", manufactured by K-I Chemical Industry Co., Ltd.) (17 parts by mass); a silane coupling agent (trade name, "Z6040", manufactured by Dow Corning Toray Co., Ltd.) (5 parts by mass); wet dispersant 1 (trade name, "disperbyk-161", manufactured by BYK) (1 part by mass); spherical fused silica (trade name, "SC2500-SQ", manufactured by Admatechs, particle diameter: 0.5 µm) (150 parts by mass); and 2-ethyl-4-methylimidazole (trade name, "2E4MZ", manufactured by Shikoku Chemicals Corp.) (0.02 parts by mass). The ratio of hydroxy group equivalent/epoxy-group equivalent of the varnish was 0.52. The varnish was diluted with methylethylketone and S glass woven cloth having a thickness of 0.1 mm was impregnated with the diluted varnish, dried by heating at 140° C. for 3 minutes to obtain a prepreg having a resin content of 46 mass %.

Example 19

A varnish was obtained in the same manner as in Example 1 except that the naphtholaralkyl-based phenol resin was not used, the content of the polyoxynaphthylene-based epoxy resin (trade name, "HP-6000") was set to be 43 parts by mass, a phenylaralkyl-based phenol resin (trade name, "KAYAHARD GPH-103", manufactured by Nippon Kayaku Co., Ltd., hydroxy group equivalent: 231 g/eq.) (10 parts by mass) and a naphthalene skeleton-based phenol resin (trade name, "EPICLON EXB-9500", manufactured by DIC, hydroxy group equivalent: 153 g/eq.) (10 parts by mass) were added. The ratio of hydroxy group equivalent/epoxy-group equivalent of the varnish was 0.49. A prepreg was obtained from the varnish in the same manner as in Example 18.

Example 20

A varnish was obtained in the same manner as in Example 19 except that cyclic epoxy-modified silicone resin 2 (trade name, "X-40-2705", manufactured by Shin-Etsu Chemical Co., Ltd., epoxy equivalent: 212 g/eq.) (17 parts by mass) represented by formula (3) was used as the cyclic epoxy-modified silicone resin. The ratio of hydroxy group equivalent/epoxy-group equivalent of the varnish was 0.51. A prepreg was obtained from the varnish in the same manner as in Example 19.

Example 21

A varnish was obtained in the same manner as in Example 19 except that cyclic epoxy-modified silicone resin 3 (trade name, "X-40-2701", manufactured by Shin-Etsu Chemical Co., Ltd., epoxy equivalent: 177 g/eq.) (17 parts by mass) represented by formula (4) was used as the cyclic epoxy-modified silicone resin. The ratio of hydroxy group equivalent/epoxy-group equivalent of the varnish was 0.48. A prepreg was obtained from the varnish in the same manner as in Example 19.

Example 22

A varnish was obtained by mixing cyclic epoxy-modified silicone resin 1 (17 parts by mass); a polyoxynaphthylene-based epoxy resin (trade name, "HP-6000") (31 part by mass); the α-naphtholaralkyl-based cyanic acid ester compound (cyanate equivalent: 261 g/eq.) (26 parts by mass) obtained in Synthesis Example 1; the maleimide compound (trade name, "BMI-2300") (26 parts by mass) used in Synthesis Example 2; a silane coupling agent (trade name, "Z6040") (5 parts by mass); wet dispersant 1 (trade name, "disperbyk-161", manufactured by BYK) (1 part by mass); wet dispersant 2 (trade name, "disperbyk-111", manufactured by BYK) (2 parts by mass); spherical fused silica (trade name, "SC2500-SQ") (200 parts by mass); and 2,4,5-triphenylimidazole (manufactured by Wako Pure Chemical Industries Ltd.) (1 part by mass) represented by formula (16) wherein $R_{11}$ and Ar are all phenyl groups. The ratio of cyanate group equivalent/epoxy-group equivalent of the varnish was 0.46. The varnish was diluted with methylethylketone and S glass woven cloth having a thickness of 0.1 mm was impregnated with the diluted varnish, dried by heating at 140° C. for 3 minutes to obtain a prepreg having a resin content of 46 mass %.

Example 23

A varnish was obtained in the same manner as in Example 22 except that cyclic epoxy-modified silicone resin 1 (25 parts by mass) and a polyoxynaphthylene-based epoxy resin (trade name, "HP-6000") (23 parts by mass) were used. The ratio of cyanate group equivalent/epoxy-group equivalent of the varnish was 0.44. A prepreg was obtained from the varnish in the same manner as in Example 22.

Example 24

A varnish was obtained in the same manner as in Example 22 except that BT resin 1 (50 parts by mass) obtained in Synthesis Example 2 was used in place of the α-naphtholaralkyl-based cyanic acid ester compound and the maleimide compound, and a polyoxynaphthylene-based epoxy resin (trade name, "HP-6000") (33 parts by mass) was used. The ratio of cyanate group equivalent/epoxy-group equivalent of the varnish was 0.51. A prepreg was obtained from the varnish in the same manner as in Example 22.

Example 25

A varnish was obtained in the same manner as in Example 22 except that BT resin 2 (52 parts by mass) obtained in Synthesis Example 3 was used in place of the α-naphtholaralkyl-based cyanic acid ester compound and the maleimide compound. The ratio of cyanate group equivalent/epoxy-group equivalent of the varnish was 0.46. A prepreg was obtained from the varnish in the same manner as in Example 22.

Example 26

A varnish was obtained in the same manner as in Example 22 except that cyclic epoxy-modified silicone resin 2 (17 parts by mass) was used. The ratio of cyanate group equivalent/epoxy-group equivalent of the varnish was 0.49. A prepreg was obtained from the varnish in the same manner as in Example 22.

Example 27

A varnish was obtained in the same manner as in Example 22 except that cyclic epoxy-modified silicone resin 3 (17 parts by mass) was used. The ratio of cyanate group equivalent/epoxy-group equivalent of the varnish was 0.45. A prepreg was obtained from the varnish in the same manner as in Example 22.

Example 28

A varnish was obtained in the same manner as in Example 22 except that the content of the spherical fused silica (trade name, "SC2500-SQ") was set to be 250 parts by mass. The ratio of cyanate group equivalent/epoxy-group equivalent of the varnish was 0.46. A prepreg was obtained from the varnish in the same manner as in Example 22.

Example 29

A varnish was obtained in the same manner as in Example 28 except that a silicone rubber powder (silicone composite powder, trade name, "KMP-600", manufactured by Shin-Etsu Chemical Co., Ltd.) (10 parts by mass) coated with a silicone resin was added. The ratio of cyanate group equivalent/epoxy-group equivalent of the varnish was 0.46. A prepreg was obtained from the varnish in the same manner as in Example 28.

Example 30

A varnish was obtained in the same manner as in Example 22 except that the spherical fused silica (trade name, "SC2500-SQ") (300 parts by mass) was used. The equivalent ratio of cyanate group/epoxy group was 0.46. A prepreg was obtained from the varnish in the same manner as in Example 22.

Example 31

A varnish was obtained in the same manner as in Example 22 except that the spherical fused silica (trade name, "SC2500-SQ") (400 parts by mass) was used. The ratio of cyanate group equivalent/epoxy-group equivalent of the varnish was 0.46. A prepreg was obtained from the varnish in the same manner as in Example 22 except that S glass woven cloth having a thickness of 0.07 mm was impregnated with the varnish so as to obtain a resin content of 62 mass %.

Example 32

A varnish was obtained in the same manner as in Example 19 except that Q woven cloth was impregnated in place of S glass woven cloth. The equivalent ratio of phenolic group/epoxy group of the varnish was 0.49. A prepreg was obtained from the varnish in the same manner as in Example 19.

Example 33

A varnish was obtained in the same manner as in Example 20 except that Q woven cloth was impregnated in place of S glass woven cloth. The ratio of hydroxy group equivalent/epoxy-group equivalent of the varnish was 0.51. A prepreg was obtained from the varnish in the same manner as in Example 20.

Example 34

A varnish was obtained in the same manner as in Example 21 except that Q woven cloth was impregnated in place of S glass woven cloth. The ratio of hydroxy group equivalent/epoxy-group equivalent of the varnish was 0.48. A prepreg was obtained from the varnish in the same manner as in Example 21.

(Preparation of Metal Foil-Clad Laminate)

Two sheets of prepreg obtained in each of Examples and Comparative Examples were laminated. An electrolytic copper foil (trade name, "3EC-III", manufactured by Mitsui Mining & Smelting Co., Ltd.,) having a thickness of 12 μm was arranged on the upper surface and the lower surface of the prepreg laminate (electrolytic copper foil/prepreg/prepreg/electrolytic copper foil) and subjected to laminate/molding at a pressure 30 kgf/cm$^2$ and a temperature of 220° C. for 120 minutes to obtain a copper clad laminate having an insulating layer of 0.1 mm in thickness.

The obtained copper clad laminates were sampled and the coefficient of thermal expansion along the plane was evaluated. The results are shown in Tables 1 to 3.

(Method for Evaluating Physical Properties of Metal Foil-Clad Laminate)

The copper clad laminates obtained above were sampled and evaluated for heat resistance, hot solder resistance after moisture absorption, coefficient of thermal expansion along the plane and chemical resistance. Individual evaluations were performed in accordance with the following methods.

(1) Heat Resistance (Float Test in Solder)

A sample (50 mm×50 mm) was floated in solder of 300° C. for 30 minutes and the time until occurrence of delamination was visually observed was measured. A case where no delamination was observed after a lapse of 30 minutes was expressed by ">30 min" in Tables.

(2) Hot Solder Resistance after Moisture Absorption

A sample (60 mm×60 mm) was soaked in an etching solution (a mixture of hydrochloric acid, water and ferric oxide or cupric oxide) of 40° C. for 5 minutes to remove whole copper foil except a half of one of the surfaces of the sample. This was used as a test piece. The test piece was treated in a pressure cooker tester ("Type PC-3", manufactured by Hirayama Manufacturing Corporation) at 121° C., 2 atm., for 3 hours and thereafter soaked in solder of 260° C. for 30 seconds. Appearance change was visually observed (the number of bulges/the number of tests: n=4). A test piece where bulge was visually observed was determined as a defective piece; whereas a test piece where no bulge was observed was determined as a non-defective piece. When the test was performed four times and evaluation was made based on the number of bulges.

(3) Coefficient of Thermal Expansion along the Plane

The copper foil of a copper clad laminate was soaked in an etching solution (mixture of hydrochloric acid, water and ferric oxide or cupric oxide) of 40° C. for 5 minutes to remove whole copper foil except a half of one of the surfaces of the sample. Thereafter, temperature was increased from 40° C. to 340° C. at a rate of 10° C. per minute by a thermomechanical analyzer (manufactured by TA Instruments). Coefficient of thermal expansion along the plane was measured from 60° C. to 120° C. Measurement was made in the longitudinal direction (warp) of the glass cloth of the laminate.

(4) Chemical Resistance

To evaluate chemical resistance in the de-smear step, the copper foil of a copper clad laminate was removed by etching and then the laminate was soaked in a swelling solution (trade name, "Swelling Dip Security Gantt P", manufactured by Atotech Japan K.K.) at 80° C. for 10 minutes. Subsequently, the laminate was soaked in a roughing solution (trade name "Concentrate Compact CP", manufactured by Atotech Japan K.K.) at 80° C. for 5 minutes. Finally, the laminate was soaked in a neutralizing solution (trade name, "reduction conditioner Security Gantt P500", manufactured by Atotech Japan K.K.) at 45° C. for 10 minutes. A series of treatments mentioned above was repeated three times and a change amount of mass (wt %) was obtained to evaluate chemical resistance. Change amount of mass (wt %)={(amount of copper clad laminate after test)−(amount of copper clad laminate before test)}/(amount of copper clad laminate before test)×100

TABLE 1

|  | Example 1 | Example 2 | Example 3 | Example 4 | Example 5 | Example 6 |
|---|---|---|---|---|---|---|
| Solder float | >30 min | >30 min | >30 min | >30 min | >30 min | >30 min |
| Hot solder resistance after moisture absorption | 0/4 | 0/4 | 0/4 | 0/4 | 0/4 | 0/4 |
| Coefficient of thermal expansion | 4.5 | 4.8 | 4.8 | 4.8 | 4.3 | 3.9 |
| Chemical resistance | −1.22 | −1.21 | −1.30 | −1.37 | −1.31 | −1.44 |
|  | Example 7 | Example 8 | Example 9 | Example 10 | Example 11 | Example 12 |
| Solder float | >30 min | >30 min | >30 min | >30 min | >30 min | >30 min |
| Hot solder resistance after moisture absorption | 0/4 | 0/4 | 0/4 | 0/4 | 0/4 | 0/4 |
| Coefficient of thermal expansion | 4.0 | 4.1 | 4.3 | 4.1 | 3.7 | 3.7 |
| Chemical resistance | −1.31 | −1.32 | −1.39 | −1.44 | −1.45 | −1.68 |
|  | Example 13 | Example 14 | Example 15 | Example 16 | Example 17 |
| Solder float | >30 min | >30 min | >30 min | >30 min | >30 min |
| Hot solder resistance after moisture absorption | 0/4 | 0/4 | 0/4 | 0/4 | 0/4 |
| Coefficient of thermal expansion | 3.2 | 2.2 | 3.8 | 3.7 | 3.5 |
| Chemical resistance | −1.44 | −1.44 | −1.18 | −1.37 | −1.46 |

Unit: coefficient of thermal expansion (ppm/° C.), chemical resistance (wt %)

TABLE 2

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 |
|---|---|---|---|---|---|---|---|---|
| Solder float | >30 min | 5 min | 5 min | 1 min | 13 min | 5 min | 5 min | >30 min |
| Hot solder resistance after moisture absorption | 0/4 | 4/4 | 4/4 | 4/4 | 0/4 | 4/4 | 4/4 | 0/4 |
| Coefficient of thermal expansion | 6.2 | 4.5 | 4.8 | 4.6 | 4.8 | 4.6 | 4.7 | 5.7 |
| Chemical resistance | −0.85 | −2.75 | −2.53 | −2.63 | −2.82 | −2.38 | −1.63 | −1.03 |
|  | Comp. Ex. 9 | Comp. Ex. 10 | Comp. Ex. 11 | Comp. Ex. 12 | Comp. Ex. 13 | Comp. Ex. 14 | Comp. Ex. 15 |
| Solder float | 4 min | 5 min | 5 min | 1 min | 10 min | 3 min | 3 min |
| Hot solder resistance after moisture absorption | 4/4 | 4/4 | 4/4 | 4/4 | 0/4 | 4/4 | 4/4 |
| Coefficient of thermal expansion | 4.3 | 4.0 | 4.1 | 4.1 | 4.3 | 4.1 | 4.2 |
| Chemical resistance | −3.05 | −3.05 | −3.05 | −3.04 | −2.73 | −2.18 | −2.09 |

Unit: coefficient of thermal expansion (ppm/° C.), chemical resistance (wt %)

TABLE 3

| | Example 18 | Example 19 | Example 20 | Example 21 | Example 22 | Example 23 |
|---|---|---|---|---|---|---|
| Solder float | >30 min | >30 min | >30 min | >30 min | >30 min | >30 min |
| Hot solder resistance after moisture absorption | 0/4 | 0/4 | 0/4 | 0/4 | 0/4 | 0/4 |
| Coefficient of thermal expansion | 4.3 | 4.6 | 4.6 | 4.6 | 4.2 | 3.9 |
| Chemical resistance | −0.70 | −0.75 | −0.80 | −0.80 | −0.75 | −0.83 |

| | Example 24 | Example 25 | Example 26 | Example 27 | Example 28 | Example 29 |
|---|---|---|---|---|---|---|
| Solder float | >30 min | >30 min | >30 min | >30 min | >30 min | >30 min |
| Hot solder resistance after moisture absorption | 0/4 | 0/4 | 0/4 | 0/4 | 0/4 | 0/4 |
| Coefficient of thermal expansion | 3.8 | 3.7 | 4.2 | 3.9 | 3.5 | 3.5 |
| Chemical resistance | −0.76 | −0.77 | −0.85 | −0.88 | −0.89 | −0.98 |

| | Example 30 | Example 31 | Example 32 | Example 33 | Example 34 |
|---|---|---|---|---|---|
| Solder float | >30 min | >30 min | >30 min | >30 min | >30 min |
| Hot solder resistance after moisture absorption | 0/4 | 0/4 | 0/4 | 0/4 | 0/4 |
| Coefficient of thermal expansion | 3.0 | 2.1 | 3.7 | 3.6 | 3.5 |
| Chemical resistance | −0.88 | −0.84 | −0.69 | −0.76 | −0.86 |

Unit: coefficient of thermal expansion (ppm/° C.), chemical resistance (wt %)

From the foregoing, it was at least confirmed that laminates of Examples are excellent in heat resistance, hot solder resistance after moisture absorption, low thermal expansibility and chemical resistance and can be suitably used in materials and the like for semiconductor plastic package requiring e.g., high heat resistance, high reliability and chemical resistance. Furthermore, it is sufficiently expected that a prepreg prepared from the resin composition of each of Examples can sufficiently maintain flame retardation required for the laminate obtained by curing the prepreg.

The present application is based on Japanese Patent Application No. 2012-231632 filed Oct. 19, 2012 with the Japan Patent Office and Japanese Patent Application No. 2013-169894 filed Aug. 19, 2013 with the Japan Patent Office, the contents of which are incorporated herein by reference.

What is claimed is:

1. A resin composition containing a cyclic epoxy-modified silicone compound (A) represented by formula (1), a cyanic acid ester compound (B) and/or a phenol resin (C) and an inorganic filler (D):

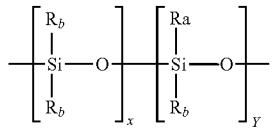

(1)

wherein $R_a$ each independently represent an organic group having an epoxy group; $R_b$ each independently represent a substituted or unsubstituted monovalent hydrocarbon group; x represents an integer of from 0 to 2; and y represents an integer of from 1 to 6; and the siloxane unit marked with x and the siloxane unit marked with y are arranged mutually at random.

2. The resin composition according to claim 1, wherein the epoxy group of the cyclic epoxy-modified silicone compound (A) represented by formula (1) is a 3,4-epoxycyclohexylethyl group.

3. The resin composition according to claim 1, wherein a ratio of a cyanate group equivalent of the cyanic acid ester compound (B) and/or a hydroxyl group equivalent of the phenol resin (C) to an epoxy group equivalent of an epoxy compound contained in the resin composition is from 0.3 to 0.7, wherein the cyanate group equivalent of the cyanic acid ester compound (B) and/or the hydroxyl group equivalent of the phenol resin (C) is set as a numerator and the epoxy group equivalent of an epoxy compound contained in the resin composition is set as a denominator.

4. The resin composition according to claim 1, further containing a non-halogen epoxy resin (E).

5. The resin composition according to claim 1, further containing a maleimide compound (F).

6. The resin composition according to claim 1, wherein the cyanic acid ester compound (B) is a naphtholaralkyl-based cyanic acid ester compound represented by formula (5) and/or a novolac-based cyanic acid ester compound represented by formula (6):

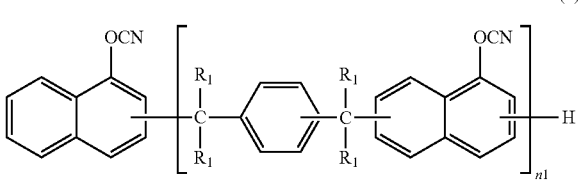

(5)

wherein $R_1$ each independently represent a hydrogen atom or a methyl group and n1 represents an integer of 1 or more,

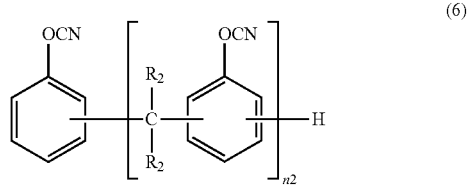

(6)

wherein $R_2$ each independently represent a hydrogen atom or a methyl group and n2 represents an integer of 1 or more.

7. The resin composition according to claim 1, wherein the phenol resin (C) is a naphtholaralkyl-based phenol resin represented by formula (7) and/or a biphenylaralkyl-based phenol resin represented by formula (8):

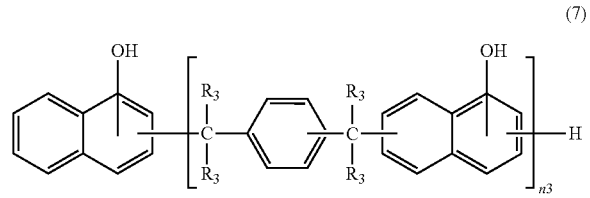

wherein $R_3$ each independently represent a hydrogen atom or a methyl group and n3 represents an integer of 1 or more,

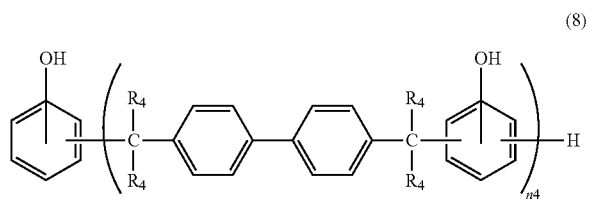

wherein $R_4$ represents a hydrogen atom or a methyl group and n4 represents an integer of 1 or more.

8. The resin composition according to claim 5, wherein the maleimide compound (F) is a compound represented by formula (15):

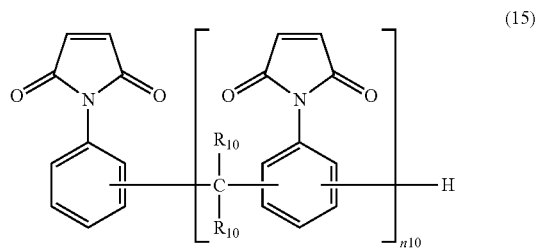

wherein $R_{10}$ each independently represent a hydrogen atom or a methyl group and n10 represents an integer of 1 or more.

9. The resin composition according to claim 5, wherein the content of the cyclic epoxy-modified silicone compound (A) based on 100 parts by mass of the total amount of the cyclic epoxy-modified silicone compound (A), the cyanic acid ester compound (B), the phenol resin (C), the non-halogen epoxy resin (E), and the maleimide compound (F) is from 5 to 50 parts by mass.

10. The resin composition according to claim 5, wherein the total content of the cyanic acid ester compound (B) and the phenol resin (C) based on 100 parts by mass of the total amount of the cyclic epoxy-modified silicone compound (A), the cyanic acid ester compound (B), the phenol resin (C), the non-halogen epoxy resin (E), and the maleimide compound (F) is from 10 to 50 parts by mass.

11. The resin composition according to claim 5, wherein the content of the inorganic filler (D) based on 100 parts by mass of the total amount of the cyclic epoxy-modified silicone compound (A), the cyanic acid ester compound (B), the phenol resin (C), the non-halogen epoxy resin (E) and the maleimide compound (F) is from 50 to 500 parts by mass.

12. The resin composition according to claim 5, wherein the content of the maleimide compound (F) based on 100 parts by mass of the total amount of the cyclic epoxy-modified silicone compound (A), the cyanic acid ester compound (B), the phenol resin (C), the non-halogen epoxy resin (E) and the maleimide compound (F) is from 5 to 50 parts by mass.

13. A resin composition containing a cyclic epoxy-modified silicone compound (A) represented by formula (1), a BT resin (G) obtained by pre-polymerizing a cyanic acid ester compound and a maleimide compound, and an inorganic filler (D):

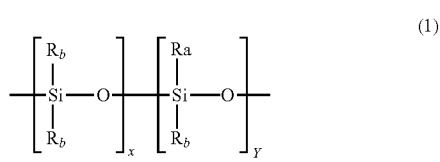

wherein $R_a$ each independently represent an organic group having an epoxy group; $R_b$ each independently represent a substituted or unsubstituted monovalent hydrocarbon group; x represents an integer of from 0 to 2; and y represents an integer of from 1 to 6; and the siloxane unit marked with x and the siloxane unit marked with y are arranged mutually at random.

14. The resin composition according to claim 13, wherein a ratio of a cyanate group equivalent of the cyanic acid ester compound used in the BT resin (G) to an epoxy group equivalent of an epoxy compound contained in the resin composition is from 0.3 to 0.7, wherein the cyanate group equivalent is set as a numerator and the epoxy group equivalent is set as a denominator.

15. The resin composition according to claim 13, further containing a non-halogen epoxy resin (E).

16. The resin composition according to claim 13, wherein the cyanic acid ester compound (B) used in the BT resin (G) is a naphtholaralkyl-based cyanic acid ester compound represented by formula (5) and/or a novolac-based cyanic acid ester compound represented by formula (6):

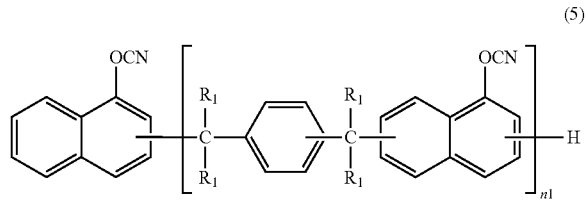

wherein $R_1$ each independently represent a hydrogen atom or a methyl group and n1 represents an integer of 1 or more,

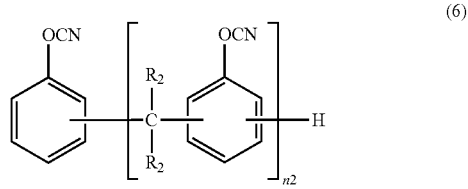

wherein $R_2$ each independently represent a hydrogen atom or a methyl group and n2 represents an integer of 1 or more.

17. The resin composition according to claim 13, wherein the maleimide compound used in the BT resin (G) is a compound represented by formula (15):

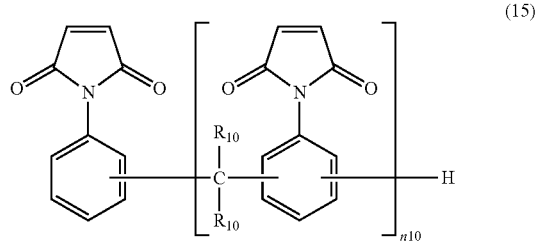

(15)

wherein $R_{10}$ each independently represent a hydrogen atom or a methyl group and n10 represents an integer of 1 or more.

18. The resin composition according to claim 15, wherein the content of the cyclic epoxy-modified silicone compound (A) based on 100 parts by mass of the total amount of the cyclic epoxy-modified silicone compound (A), the BT resin (G) and the non-halogen epoxy resin (E) is from 5 to 50 parts by mass.

19. The resin composition according to claim 15, wherein the content of the BT resin (G) based on 100 parts by mass of the total amount of the cyclic epoxy-modified silicone compound (A), the BT resin (G) and the non-halogen epoxy resin (E) is from 20 to 80 parts by mass.

20. The resin composition according to claim 15, wherein the content of the inorganic filler (D) based on 100 parts by mass of the total amount of the cyclic epoxy-modified silicone compound (A), the BT resin (G) and the non-halogen epoxy resin (E) is from 50 to 500 parts by mass.

21. The resin composition according to claim 1, further containing an imidazole compound (H) represented by formula (16):

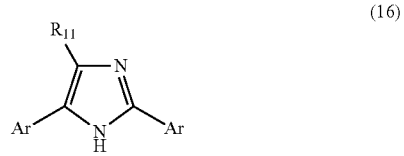

(16)

wherein Ar each independently represent one selected from the group consisting of a phenyl group, a naphthalene group, a biphenyl group, an anthracene group or groups obtained by modifying these groups with a hydroxyl group; $R_{11}$ represents a hydrogen atom, an alkyl group, an alkyl group modified with a hydroxyl group or an aryl group.

22. The resin composition according to claim 21, wherein the imidazole compound (H) is 2,4,5-triphenylimidazole.

23. The resin composition according to claim 1, wherein the inorganic filler (D) is boehmite and/or silica.

24. The resin composition according to claim 4, wherein the non-halogen epoxy resin (E) is one or more selected from the group consisting of a phenolphenylaralkyl novolac-based epoxy resin, a biphenylaralkyl-based epoxy resin, a naphtholaralkyl-based epoxy resin, an anthraquinone-based epoxy resin and a polyoxynaphthylene-based epoxy resin.

25. A prepreg comprising the resin composition according to claim 1 and a substrate impregnated or coated with the resin composition.

26. The prepreg according to claim 25, wherein the substrate is one or more selected from the group consisting of E glass cloth, T glass cloth, S glass cloth, Q glass cloth, an organic fiber and an organic film.

27. A laminate comprising the prepreg according to claim 25.

28. A metal foil-clad laminate comprising
the prepreg according to claim 25 and
a metal foil laminated on the prepreg.

29. A printed-wiring board comprising
an insulating layer containing the resin composition according to claim 1 and
a conductive layer formed on a surface of the insulating layer.

30. The resin composition according to claim 13, further containing an imidazole compound (H) represented by formula (16):

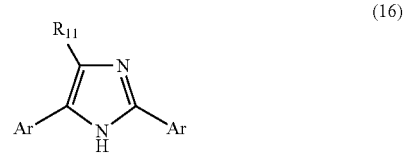

(16)

wherein Ar each independently represent one selected from the group consisting of a phenyl group, a naphthalene group, a biphenyl group, an anthracene group or groups obtained by modifying these groups with a hydroxyl group; $R_{11}$ represents a hydrogen atom, an alkyl group, an alkyl group modified with a hydroxyl group or an aryl group.

31. The resin composition according to claim 30, wherein the imidazole compound (H) is 2,4,5-triphenylimidazole.

32. The resin composition according to claim 13, wherein the inorganic filler (D) is boehmite and/or silica.

33. The resin composition according to claim 15, wherein the non-halogen epoxy resin (E) is one or more selected from the group consisting of a phenolphenylaralkyl novolac-based epoxy resin, a biphenylaralkyl-based epoxy resin, a naphtholaralkyl-based epoxy resin, an anthraquinone-based epoxy resin and a polyoxynaphthylene-based epoxy resin.

34. A prepreg comprising
the resin composition according to claim 13 and
a substrate impregnated or coated with the resin composition.

35. The prepreg according to claim 34, wherein the substrate is one or more selected from the group consisting of E glass cloth, T glass cloth, S glass cloth, Q glass cloth, an organic fiber and an organic film.

36. A laminate comprising the prepreg according to claim 34.

37. A metal foil-clad laminate comprising
the prepreg according to claim 34 and
a metal foil laminated on the prepreg.

38. A printed-wiring board comprising
an insulating layer containing the resin composition according to claim 13 and
a conductive layer formed on a surface of the insulating layer.

* * * * *